(12) United States Patent
Oishi

(10) Patent No.: US 10,129,641 B2
(45) Date of Patent: *Nov. 13, 2018

(54) AUDIO REPRODUCTION DEVICE TARGET SOUND SIGNATURE

(71) Applicant: Skullcandy, Inc., Park City, UT (US)

(72) Inventor: Tetsuro Oishi, Park City, UT (US)

(73) Assignee: Skullcandy, Inc., Park City, UT (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/189,894

(22) Filed: Jun. 22, 2016

(65) Prior Publication Data

US 2016/0302007 A1 Oct. 13, 2016

Related U.S. Application Data

(63) Continuation of application No. 13/734,812, filed on Jan. 4, 2013.

(60) Provisional application No. 61/584,748, filed on Jan. 9, 2012.

(51) Int. Cl.

| H04R 3/04 | (2006.01) |
| G06F 17/30 | (2006.01) |
| G06F 3/16 | (2006.01) |
| G10L 25/51 | (2013.01) |
| H04R 29/00 | (2006.01) |
| H04R 5/033 | (2006.01) |
| H04S 7/00 | (2006.01) |

(52) U.S. Cl.
CPC ......... *H04R 3/04* (2013.01); *G06F 17/30755* (2013.01); *G10L 25/51* (2013.01); *H04R 5/033* (2013.01); *H04R 29/001* (2013.01); *H04S 7/301* (2013.01); *H04R 2460/15* (2013.01)

(58) Field of Classification Search
CPC ........ H03G 5/165; H03G 5/005; H03G 9/005; H03G 5/025; H03G 3/32; H04S 7/301; H04S 7/307; H04R 3/04; H04R 29/001; H04R 2460/15; H04R 5/033; G10L 25/51; G06F 17/30755
USPC .............................. 381/101, 102, 103, 56, 61
See application file for complete search history.

(56) References Cited

U.S. PATENT DOCUMENTS

| 4,684,886 A | 8/1987 | Doyle |
| 4,845,758 A | 7/1989 | Op de Beek et al. |
| 5,524,290 A | 6/1996 | Ecklund et al. |
| 5,768,398 A | 6/1998 | Janse et al. |
| 6,195,438 B1 | 2/2001 | Yumoto et al. |
| 6,333,802 B1 | 12/2001 | Ogawa et al. |

(Continued)

*Primary Examiner* — Vivian Chin
*Assistant Examiner* — Douglas Suthers
(74) *Attorney, Agent, or Firm* — TraskBritt

(57) ABSTRACT

A system for tuning an audio reproduction device is disclosed. The system includes an audio signal generator for generating an audio signal to be played back in an audio reproduction device and sending the audio signal to the audio reproduction device; a microphone signal module for receiving a microphone signal from a microphone, the microphone signal recording a sound wave reproduced by the audio reproduction device when the audio signal is played back in the audio reproduction device; a comparison module for determining whether the microphone signal matches target sound signature data; and a filter module for applying a digital filter to emulate a target sound signature responsive to determining that the microphone signal does not match the target sound signature data.

18 Claims, 19 Drawing Sheets

(56) References Cited

U.S. PATENT DOCUMENTS

| | | |
|---|---|---|
| 6,721,428 B1 | 4/2004 | Allred et al. |
| 7,409,067 B2 | 8/2008 | Yoshino |
| 7,483,540 B2 * | 1/2009 | Rabinowitz ............. H04S 7/307 |
| | | 381/103 |
| 8,855,343 B2 | 10/2014 | Usher et al. |
| 2001/0043704 A1 | 11/2001 | Schwartz |
| 2004/0252846 A1 | 12/2004 | Nonaka et al. |
| 2007/0154049 A1 * | 7/2007 | Levitsky ............. H04R 1/1083 |
| | | 381/371 |
| 2008/0118078 A1 * | 5/2008 | Asada .................... H04S 3/008 |
| | | 381/74 |
| 2008/0175411 A1 | 7/2008 | Greve |
| 2008/0285775 A1 | 11/2008 | Christoph et al. |
| 2009/0290725 A1 | 11/2009 | Huang |

* cited by examiner

400

Instructions:

Please fill in the questionnaire below and we will provide you awesome products matching to your answers.

- What genre of music do you like?

○ Pop    ○ Rock    ○ Classic    ○ Other (Please specify:____)

- Which artist do you like?

(Please fill in your favorite artists)

- What price?

○ Below $15    ○ Between $15 and $30    ○ Above $30

- What color do you like?

○ White    ○ Black    ○ Silver    ○ Other (Please specify:____)

- Pick a category

○ Wireless headset    ○ Cellular headset    ○ Corded headset
  ○ Computer headset

402

Other specifications?

[            ]
— 404

[ Submit ]    [ Cancel ]
450

Figure 4

AUDIO REPRODUCTION DEVICE TARGET SOUND SIGNATURE

CROSS-REFERENCE TO RELATED APPLICATIONS

This application is a continuation application of U.S. patent application Ser. No. 13/734,812, entitled "Audio Reproduction Device Target Sound Signature," filed Jan. 4, 2013, now U.S. Pat. No. 9,735,751, issued Aug. 15, 2017, which claims priority under 35 USC § 119(e) to U.S. Provisional Patent Application Ser. No. 61/584,748, entitled "Audio Reproduction Device," filed Jan. 9, 2012, the entirety of each of which is incorporated into this document by reference.

TECHNICAL FIELD

The specification relates to audio reproduction devices. In particular, the specification relates to interacting with audio reproduction devices.

BACKGROUND

Users can listen to music using a music player and a headset. When using an audio reproduction device such as a headset to listen to music, a user may want to improve sound quality in the audio reproduction device. A user may also want to look for new audio reproduction devices and new music that match the user's interest. It is desirable to improve sound quality in an audio reproduction device when a user uses the audio reproduction device to listen to music. It is also desirable to provide device recommendation and/or music recommendation to a user.

BRIEF SUMMARY

A system for tuning an audio reproduction device is disclosed. The system includes: an audio signal generator for generating an audio signal to be played back in an audio reproduction device and sending the audio signal to the audio reproduction device; a microphone signal module for receiving a microphone signal from a microphone, the microphone signal recording a sound wave reproduced by the audio reproduction device when the audio signal is played back in the audio reproduction device; a comparison module for determining whether the microphone signal matches target sound signature data; and a filter module for applying a digital filter to emulate a target sound signature responsive to determining that the microphone signal does not match the target sound signature data.

The system is particularly advantageous in numerous respects. For example, the system provides target sound signature data describing a target sound signature and/or a sound signature within a target sound range. The system tunes audio reproduction devices to reproduce a sound wave matching either the target sound signature or a sound signature within the target sound range. The system also has numerous other advantages.

BRIEF DESCRIPTION OF THE DRAWINGS

The disclosure is illustrated by way of example, and not by way of limitation in the figures of the accompanying drawings in which like reference numerals are used to refer to similar elements.

FIG. 4 is a graphic representation illustrating an example user interface depicting one or more queries according to one embodiment.

DETAILED DESCRIPTION

Figure 1:
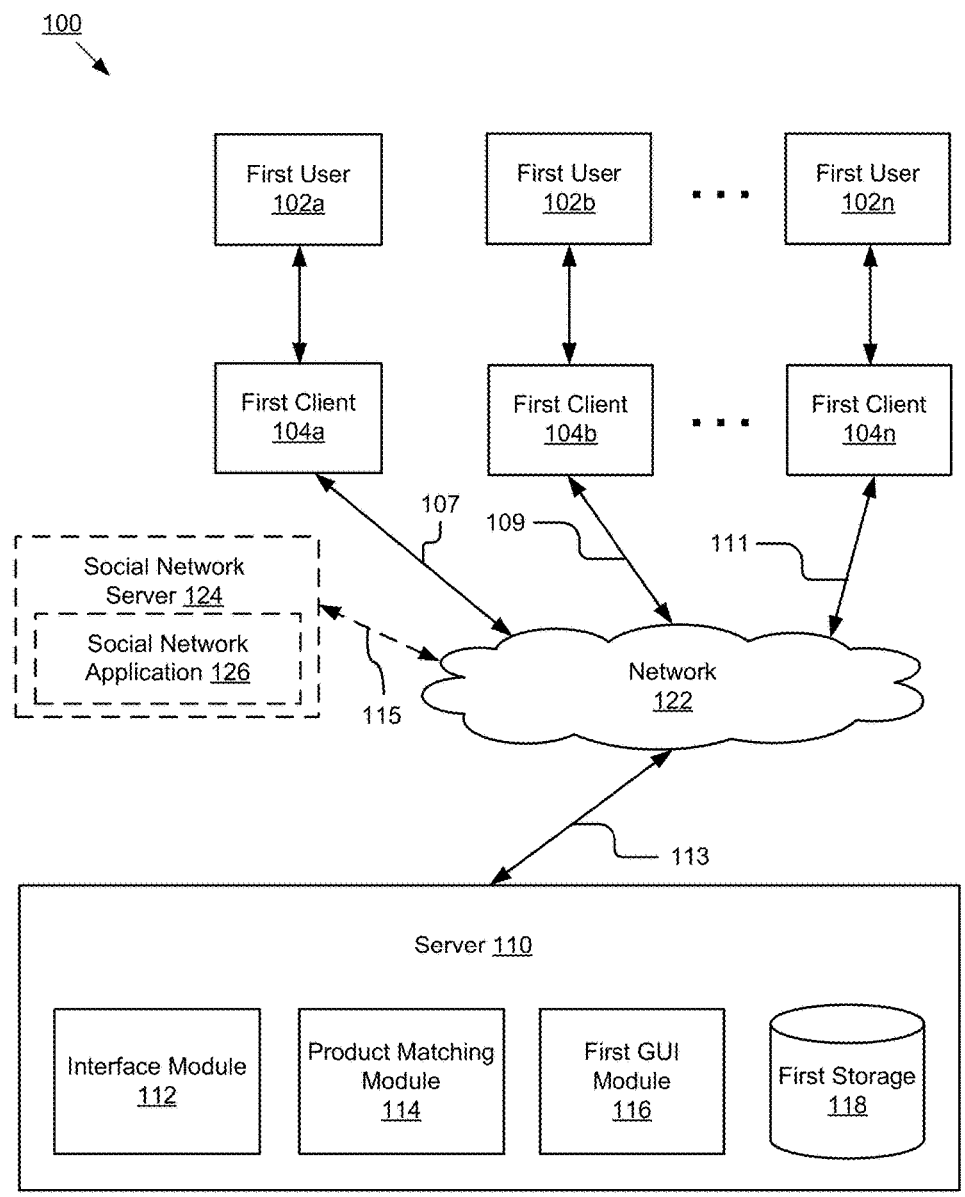
FIG. 1 illustrates a high-level block diagram of a product matching system for determining one or more matching products for a user according to one embodiment.

FIG. 1 is a high-level block diagram illustrating a product matching system 100 for determining one or more matching products for a user according to one embodiment. The product matching system 100 includes a server 110 and one or more first clients 104a, 104b . . . 104n (referred to individually or collectively as first client 104) that interact with one or more first users 102a, 102b . . . 102n (referred to individually or collectively as first user 102). The product matching system 100 optionally includes a social network server 124. In the illustrated embodiment, the entities of the product matching system 100 are communicatively coupled to each other via a network 122. Although only three first clients 104a, 104b . . . 104n and one server 110 are illustrated, the system 100 can include any number of first clients 104 and any number of servers 110. While a single network 122 is shown in FIG. 1, the product matching system 100 may include any number of networks 122.

The first client 104a is communicatively coupled to the network 122 via signal line 107. The first client 104b is communicatively coupled to the network 122 via signal line 109. The first client 104n is communicatively coupled to the network 122 via signal line 111. The server 110 is communicatively coupled to the network 122 via signal line 113. The social network server 124 is communicatively coupled to the network 122 via signal line 115. In one embodiment, signal lines 107, 109, 111, 113 and 115 are wireless connections such as wireless Local Area Network (LAN) connections, BLUETOOTH® connections, etc. In another embodiment, signal lines 107, 109, 111, 113 and 115 are wired connections such as connections via a cable, a landline, etc. In yet another embodiment, signal lines 107, 109, 111, 113 and 115 are any combination of wireless connections and wired connections.

The first client 104 is any processor-based computing device. The first client 104 executes client software such as a web browser or built-in client application and connects to the server 110 via the network 122. In one embodiment, the first client 104 includes a variety of different computing devices. Examples of a first client device 104 include, but are not limited to: a personal computer; a personal digital assistant; a television set-top box; a tablet computer; a cell phone (e.g., a smartphone); a laptop computer; a portable music player; a video game player; and any other electronic device including a processor and a memory. The first client 104 includes a processor (not shown), a memory (not shown) and other components conventional to a computing device. A first user 102 interacts with a first client 104. A first user 102 is, for example, a human user.

The server 110 is any computing device having a processor (not shown) and a computer-readable storage medium (not shown) storing data for providing matching products to users. In the depicted embodiment, the server 110 includes an interface module 112, a product matching module 114, a first Graphical User Interface (GUI) module 116 and a first storage device 118. In one embodiment, the components of the server 110 are communicatively coupled to each other.

The interface module 112 is an interface for connecting the server 110 to a network 122. For example, the interface module 112 is a network adapter that connects the server 110 to the network 122. In one embodiment, the interface module 112 includes code and routines for handling communication between components of the server 110 and other entities of the product matching system 100. For example, the interface module 112 receives data from a first client 104 via the network 122 and sends the data to the product matching module 114. In another example, the interface module 112 receives graphical data for depicting a user interface from the first GUI module 116 and sends the graphical data to a first client 104 via the network 122, causing the first client 104 to present the user interface to a first user 102.

In one embodiment, the interface module 112 includes a port for direct physical connection to the network 122 or to another communication channel. For example, the interface module 112 includes a Universal Serial Bus (USB), category 5 cable (CAT-5) or similar port for wired communication with the network 122. In another embodiment, the interface module 112 includes a wireless transceiver for exchanging data with the network 122, or with another communication channel, using one or more wireless communication methods, such as IEEE 802.11, IEEE 802.16, BLUETOOTH®, near field communication (NFC) or another suitable wireless communication method. In one embodiment, the interface module 112 includes a NFC chip that generates a radio frequency (RF) for short-range communication.

In some embodiments, the interface module 112 includes a cellular communications transceiver for sending and receiving data over a cellular communications network including via short messaging service (SMS), multimedia messaging service (MMS), hypertext transfer protocol (HTTP), direct data connection, wireless application protocol (WAP), email, or another suitable type of electronic communication. In some embodiments, the interface module 112 also provides other conventional connections to the network 122 for distribution of files and/or media objects using standard network protocols including TCP/IP, HTTP, HTTPS and SMTP, etc.

The product matching module 114 is code and routines for determining one or more matching products for a first user 102. In one embodiment, the product matching module 114 includes code and routines stored in an on-chip storage (not shown) of a processor (not shown) included in the server 110. In another embodiment, the product matching module 114 is implemented using hardware such as a field-programmable gate array (FPGA) or an application-specific integrated circuit (ASIC). In yet another embodiment, the product matching module 114 is implemented using a combination of hardware and software. The product matching module 114 is described below in more detail with reference to FIGS. 2 and 3.

A matching product can be an audio reproduction device that matches answers provided by the first user 102 for one or more queries. Examples of the queries are shown below in FIG. 4. In one embodiment, a matching product is a product that matches a first user's 102 interest. For example, a matching product is a headset that a first user 102 has added to a "wish list." In another example, a matching product is an album issued by the first user's 102 favorite band.

An audio reproduction device can be any type of audio reproduction device such as a headphone device, an earbud device, a speaker dock, a speaker system, a super-aural and a supra-aural headphone device, an in-ear headphone device, a headset or any other audio reproduction device, etc. In one embodiment, the audio reproduction device is a product that is sold by an entity associated with the product matching system.

The first GUI module 116 is code and routines for generating graphical data for providing a GUI to a first user 102. In one embodiment, the first GUI module 116 retrieves data (e.g., query data, suggestion data) from the first storage 118 and generates graphical data for providing a GUI to a first user 102 based on the retrieved data. The query data and the suggestion data are described below with reference to FIG. 2. In another embodiment, the first GUI module 116 receives data describing one or more matching products and generates graphical data for providing a GUI depicting the one or more matching products. The first GUI module 116 sends the graphical data to the interface module 112. The interface module 112 sends the graphical data to a first client 104, causing the first client 104 to present the GUI to a first user 102.

The first storage device 118 is a non-transitory memory that stores data. For example, the first storage device 118 is a dynamic random access memory (DRAM) device, a static random access memory (SRAM) device, Flash memory or some other memory device. In one embodiment, the first storage device 118 also includes a non-volatile memory or similar permanent storage device and media such as a hard disk drive, a floppy disk drive, a compact disc read only memory (CD-ROM) device, a digital versatile disc read only memory (DVD-ROM) device, a digital versatile disc random access memory (DVD-RAM) device, a digital versatile disc rewritable (DVD-RW) device, a Flash memory device, or some other non-volatile storage device. The first storage device 118 is described below in more detail with reference to FIG. 2.

The network 122 is a conventional type of network, wired or wireless, and may have any number of configurations such as a star configuration, token ring configuration or other configurations. In one embodiment, the network 122 includes one or more of a local area network (LAN), a wide area network (WAN) (e.g., the Internet) and/or any other interconnected data path across which multiple devices communicate. In another embodiment, the network 122 is a peer-to-peer network. The network 122 is coupled to or includes portions of a telecommunications network for sending data in a variety of different communication protocols. For example, the network 122 is a 3G network or a 4G network. In yet another embodiment, the network 122 includes BLUETOOTH® communication networks or a cellular communication network for sending and receiving data such as via short messaging service (SMS), multimedia messaging service (MMS), hypertext transfer protocol (HTTP), direct data connection, wireless application protocol (WAP), email, etc. In yet another embodiment, all or some of the links in the network 122 are encrypted using conventional encryption technologies such as secure sockets layer (SSL), secure HTTP and/or virtual private networks (VPNs).

The social network server 124 is any computing device having a processor (not shown) and a computer-readable storage medium (not shown) storing data for providing a social network to users. Although only one social network server 124 is shown in FIG. 1, multiple social network servers 124 may be present. A social network is any type of social structure where the users are connected by a common feature including friendship, family, work, an interest, etc. The common features are provided by one or more social networking systems, such as those included in the product matching system 100, including explicitly-defined relationships and relationships implied by social connections with other users, where the relationships are defined in a social graph. The social graph is a mapping of all users in a social network and how they are related to each other.

In the depicted embodiment, the social network server 124 includes a social network application 126. The social network application 126 includes code and routines stored on a memory (not shown) of the social network server 124 that, when executed by a processor (not shown) of the social network server 124, causes the social network server 124 to provide a social network accessible by a first client 104 via the network 122. In one embodiment, a first user 102 publishes comments on the social network. For example, a first user 102 provides a brief review of a headset product on the social network and other first users 102 post comments on the brief review. In another embodiment, a first user 102 marks a product as a "liked" product on a social network. Social activities that a first user 102 performs on a social network include, but are not limited to, posting a comment on a product review, endorsing a product, publishing a post related to a product, conducting a review for a product and adding a playlist including one or more favorite pieces of music, etc. In one embodiment, the product matching module 114 determines a product that matches a first user's 102 interest and the matching product is posted on the social network in association with the first user's 102 social network account.

Figure 2:
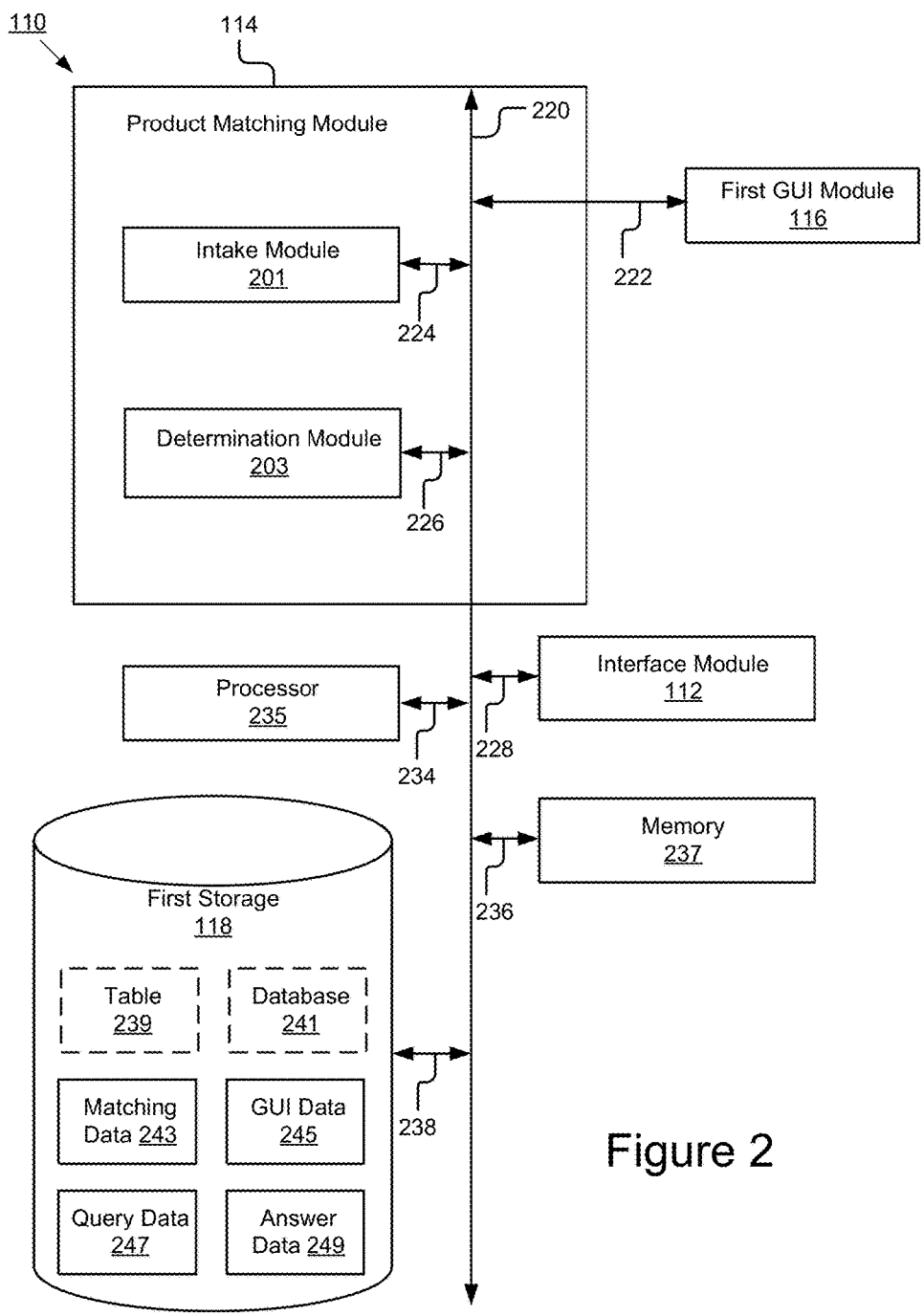
FIG. 2 is a block diagram illustrating a product matching module according to one embodiment.

Referring now to FIG. 2, an example of the product matching module 114 is shown in more detail. FIG. 2 is a block diagram illustrating a server 110 that includes a product matching module 114, a processor 235, a memory 237, an interface module 112, a first storage 118 and a first GUI module 116 according to some embodiments. The components of the server 110 are communicatively coupled to each other via a bus 220. For example, the processor 235 is communicatively coupled to the bus 220 via signal line 234. The memory 237 is communicatively coupled to the bus 220 via signal line 236. The interface module 112 is communicatively coupled to the bus 220 via signal line 228. The first storage 118 is communicatively coupled to the bus 220 via signal line 238. The first GUI module 116 is communicatively coupled to the bus 220 via signal line 222.

The processor 235 includes an arithmetic logic unit, a microprocessor, a general purpose controller or some other processor array to perform computations and retrieve data stored on the first storage 118, etc. The processor 235 processes data signals and may include various computing architectures including a complex instruction set computer (CISC) architecture, a reduced instruction set computer (RISC) architecture, or an architecture implementing a combination of instruction sets. Although only a single processor 235 is shown in FIG. 2, multiple processors 235 may be included. The processing capability may be limited to supporting the display of images and the capture and transmission of images. The processing capability might be enough to perform more complex tasks, including various types of feature extraction and sampling. In other embodiments, other processors, operating systems, sensors, displays and physical configurations are possible.

The memory 237 stores instructions and/or data that may be executed by the processor 235. The instructions and/or data may include code for performing any and/or all of the techniques described herein. The memory 237 may be a dynamic random access memory (DRAM) device, a static random access memory (SRAM) device, Flash memory or some other memory device. In one embodiment, the memory 237 also includes a non-volatile memory or similar permanent storage device and media such as a hard disk drive, a floppy disk drive, a CD-ROM device, a DVD-ROM device, a DVD-RAM device, a DVD-RW device, a Flash memory device, or some other mass storage device for storing information on a more permanent basis.

In the illustrated embodiment, the first storage 118 stores data that includes matching data 243, GUI data 245, query data 247 and answer data 249. In one embodiment, the matching data 243 is stored in a table 239. In another embodiment, the matching data 243 is stored in a database 241. The table 239 and the database 241 are depicted using dashed lines to indicate that they are optional features.

The table 239 is a table for storing the matching data 243. In one embodiment, the table 239 includes one or more rows and/or one or more columns for storing data describing one or more products. For example, the table 239 stores data describing the color, price, features and technical specifications for a product. In one embodiment, a product is an audio reproduction device such as headphones, a headset, a speaker, a super-aural and a supra-aural headphone device, an in-ear headphone device, an earbud headphone device, a speaker dock or any other audio reproduction device.

The database 241 stores the matching data 243. In one embodiment, the database 241 stores data describing one or more products. For example, the database 241 stores data describing the color, price, features and technical specifications for a product. The database 241 may store any other data for providing the functionality described herein.

The matching data 243 is data describing one or more products. For example, the matching data 243 includes data describing the color, price, features and technical specifications for one or more products. In one embodiment, the features for a product include one or more of a connection type (e.g., corded, wireless, etc.), a wearing style (e.g., over-the-head, over-the-ear or convertible between over-the-head and over-the-ear, etc.) and an ear style (e.g., single ear version, dual ear version, etc.). In some embodiments, other features such as including a built-in microphone (e.g., noise-cancelling microphone) are possible. In one embodiment, the matching data 243 is utilized by the product matching module 114 to determine a product that best matches the answers provided by a first user 102.

The GUI data 245 is graphical data for providing one or more GUIs to a first user 102. For example, the GUI data 245 includes graphical data for providing a GUI that depicts a questionnaire including one or more queries for the first user 102. In some embodiments, the GUI data 245 may include any other graphical data for depicting the GUIs described herein (e.g., the GUI depicted below in FIG. 4).

The query data 247 is data describing one or more queries. For example, the query data 247 includes data describing one or more queries that are provided to the first user 102. Examples of the queries include, but are not limited to: who is the first user's 102 favorite music artist; what genre of music the first user 102 likes; what price range the first user 102 prefers; and what features the first user 102 prefers in a product (e.g., over-ear or in-ear style, noise-cancelling features, etc.). Examples of the queries are illustrated below in FIG. 4.

The answer data 249 is data describing one or more answers provided by the first user 102 to the one or more queries. For example, the answer data 249 includes data describing one or more answers to the queries presented in a user interface. In one embodiment, the answer data 249 includes data describing one or more comments provided by the first user 102.

In the depicted embodiment shown in FIG. 2, the product matching module 114 includes an intake module 201 and a determination module 203. The intake module 201 is communicatively coupled to the bus 220 via signal line 224. The determination module 203 is communicatively coupled to the bus 220 via signal line 226.

The intake module 201 is code and routines that, when executed by the processor 235, receives answer data from a first user 102. In one embodiment, the first GUI module 116 retrieves query data describing one or more queries from the first storage 118 and generates graphical data for providing a GUI that depicts the one or more queries. An example of a GUI is shown in FIG. 4. The first GUI module 116 sends the graphical data to a first client 104, causing the first client 104 to present the GUI to the first user 102. The first user 102 answers the one or more queries depicted in the GUI and provides the answer data describing the one or more answers to the interface module 112. The interface module 112 sends the answer data to the intake module 201. In one embodiment, the intake module 201 stores the answer data in the first storage 118. In another embodiment, the intake module 201 sends the answer data to the determination module 203.

The determination module 203 is code and routines that, when executed by the processor 235, determines one or more matching products for a first user 102. In one embodiment, the determination module 203 receives the answer data from the intake module 201. The determination module 203 cross-references the matching data using the answer data and determines one or more matching products for a first user 102 based on the answer data. For example, the determination module 203 retrieves matching data from the first storage 118, compares the answer data to the matching data and determines one or more products described by the matching data that best matches the answer data.

In one embodiment, the determination module 203 stores product data describing the one or more matching products in the first storage 118. In another embodiment, the determination module 203 sends the product data to the first GUI module 116, causing the first GUI module 116 to generate graphical data for providing a GUI that depicts the one or more matching products. The first GUI module 116 sends the graphical data to the first client 104, causing the first client 104 to present the matching products to the first user 102 via the GUI.

Figure 3:
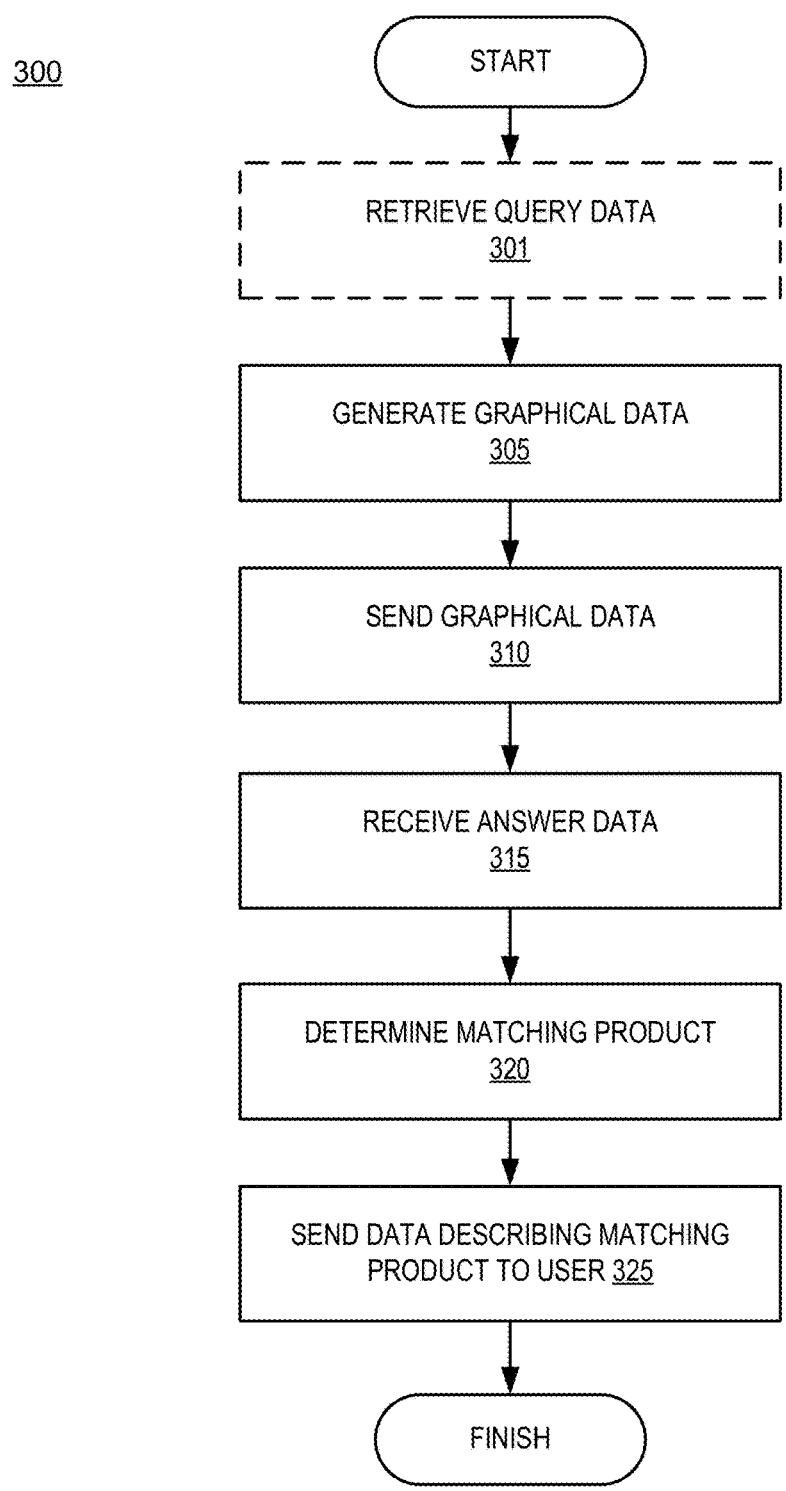
FIG. 3 is a flowchart illustrating a method for determining one or more matching products for a user according to one embodiment.

FIG. 3 is a flowchart illustrating a method 300 for determining one or more matching products for a first user 102 according to one embodiment. In the illustrated embodiment, the first GUI module 116 optionally retrieves 301 query data from the first storage 118. The first GUI module 116 generates 305 graphical data for providing a GUI that depicts one or more queries. In one embodiment, the first GUI module 116 generates the graphical data based on the query data. The first GUI module 116 sends 310 the graphical data to the interface module 112. The interface module 112 sends the graphical data to a first client 104, causing the first client 104 to present the GUI to a first user 102. The first user 102 submits one or more answers to the one or more queries via the GUI, causing the first client 104 to send answer data describing the one or more answers to the interface module 112 via the network 122. The intake module 201 receives 315 the answer data from the first client 104 via the interface module 112. The determination module 203 determines 320 one or more matching products for the first user 102 based on the answer data. The determination module 203 sends 325 product data describing the one or more matching products to the first client 104 via the interface module 112 and the network 122, causing the first client 104 to present the one or more matching products to the first user 102.

FIG. 4 is a graphical representation illustrating a GUI 400 for depicting one or more queries 402 according to one embodiment. In the illustrated embodiment, the one or more queries 402 request answers for a genre of music, a favorite artist, a price range, a color and a category for a headset, etc. The GUI 400 also includes a comment box 404 that allows a first user 102 to provide additional answer data. The first user 102 answers the one or more queries included in the GUI 400 and sends the answer data to the product matching module 114 by clicking on a "submit" button 450.

Figure 5:
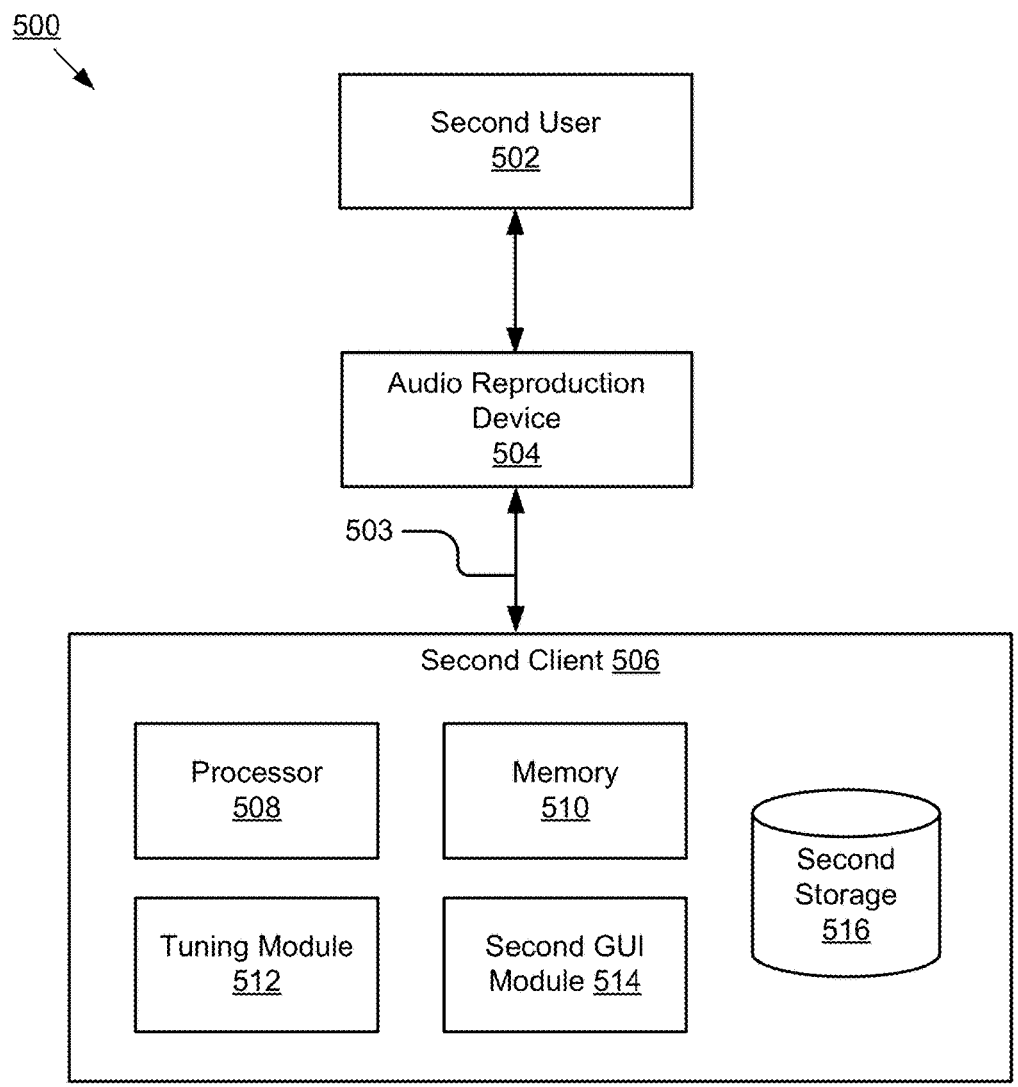
FIG. 5 is a high-level block diagram of a tuning system for tuning an audio reproduction device according to one embodiment.

FIG. 5 is a high-level block diagram of a tuning system 500 for tuning an audio reproduction device according to one embodiment. The example system 500 includes a second client 506 and an audio reproduction device 504 that interacts with a second user 502. The entities of the system 500 are communicatively coupled to each other. The audio reproduction device 504 is communicatively coupled to the second client 506 via signal line 503. Although only one audio reproduction device 504 and one second client 506 are shown in FIG. 5, the system 500 may include any number of audio reproduction devices 504 and/or any number of second clients 506. In one embodiment, the tuning system 500 tunes the audio reproduction device 504 to reproduce a sound wave that matches a target sound signature. In another embodiment, the tuning system 500 tunes the audio reproduction device 504 to reproduce a sound wave that matches a sound signature within a target sound range. The target sound signature and the target sound range are described below in more detail with reference to FIGS. 8, 9 and 18.

Figure 9:
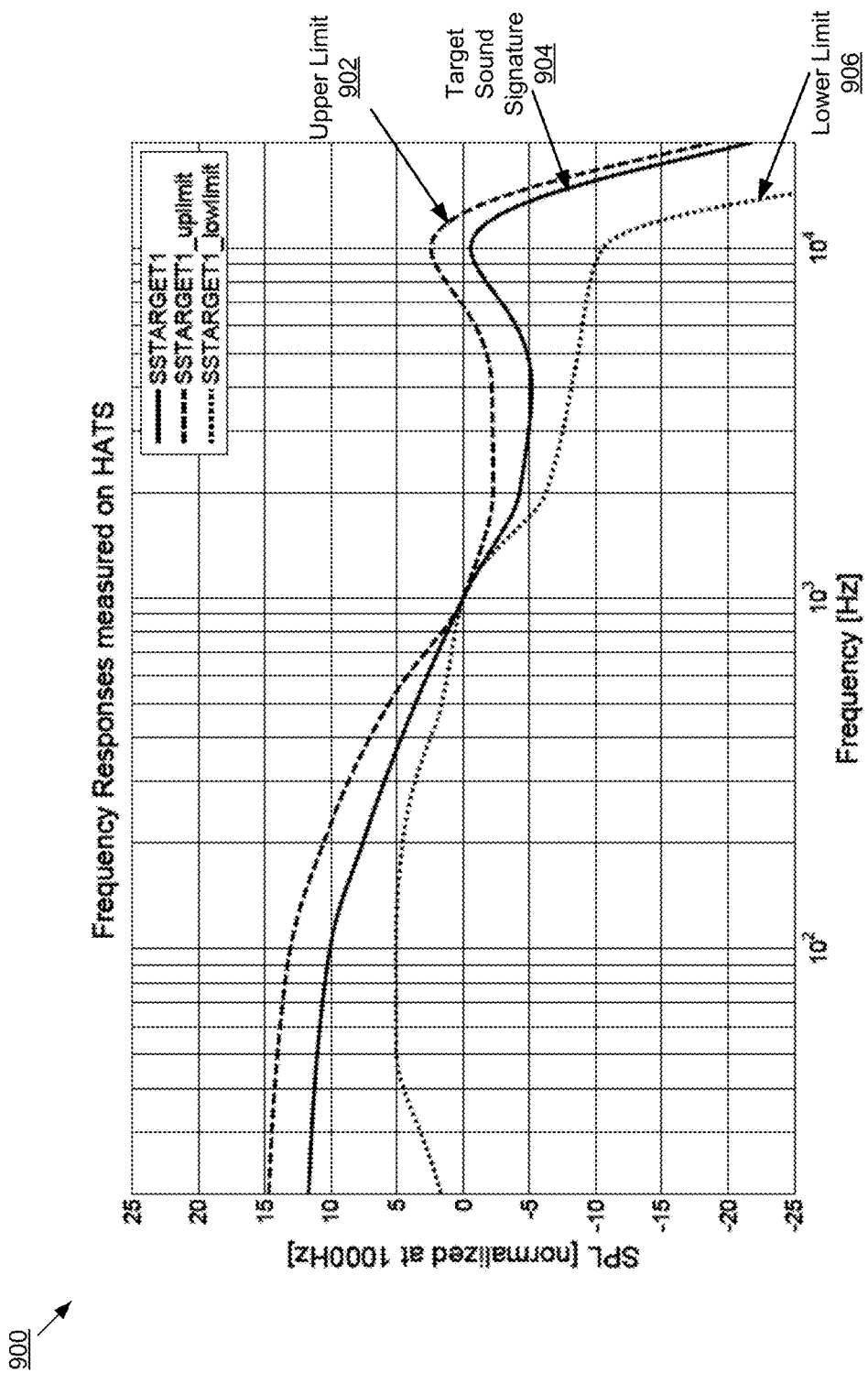
FIG. 9 is a graphical representation illustrating a target sound signature and a target sound range according to one embodiment.

The audio reproduction device 504 is an apparatus for producing a sound wave from an audio signal. For example, the audio reproduction device 504 is a headphone device, an earbud device, a speaker dock, an in-ear headphone device, a speaker device, etc. In one embodiment, the audio reproduction device 504 includes a cup, an ear pad coupled to a top edge of the cup, a driver coupled to an inner wall of the cup, and a microphone coupled to the wall of the cup. The audio reproduction device 504 is further described below with reference to FIGS. 6 and 7 and 11-17. In one embodiment, the audio reproduction device 504 is configured to reproduce a sound wave that matches a target sound signature as illustrated in FIG. 9 or FIG. 18. In another embodiment, the audio reproduction device 504 is configured to reproduce a sound wave that matches a sound signature within a target sound range as illustrated in FIG. 9 or FIG. 18.

The second client 506 is any processor-based computing device capable of playback of audio files (MP3 files, AAC files, etc.). Examples of a second client 506 include, but are not limited to: an audio player (e.g., any MP3 player); a personal computer; a personal digital assistant; a television set-top box; a tablet computer; a smartphone; a cell phone; and a laptop computer, etc. In one embodiment, the second client 506 performs the functionality described above for the first client 104 (FIG. 1). A second user 502 interacts with the second client 506 and the audio reproduction device 504. The second user 502 is, for example, a human user. In one embodiment, the second user 502 is the same user as the first user 102 (FIG. 1). In another embodiment, the second user 502 is different from the first user 102.

In the illustrated embodiment, the second client 506 includes a processor 508, a memory 510, a tuning module 512, a second GUI module 514 and a second storage device 516. The components of the second client 506 are communicatively coupled to each other.

The processor 508 has similar structures and provides similar functionality as the processor 235 described above. The memory 510 has similar structures and provides similar functionality as the memory 237 described above. The second storage 516 has similar structures and provides similar functionality as the first storage 118 described above. The description will not be repeated here. The second storage 516 is further described below in more detail with reference to FIG. 8.

The tuning module 512 is code and routines that, when executed by the processor 508, tunes the audio reproduction device 504 to reproduce a sound wave. In one embodiment, the reproduced sound wave matches a target sound signature. In another embodiment, the reproduced sound wave matches a sound signature within a target sound range. In one embodiment, the tuning module 512 includes code and routines stored in an on-chip storage (not shown) of the processor 508. In another embodiment, the tuning module 512 is implemented using hardware such as an FPGA or an ASIC. In yet another embodiment, the tuning module 512 is implemented using a combination of hardware and software. The tuning module 512 is described below with reference to FIGS. 8, 10A and 10B.

The second GUI module 514 is code and routines that, when executed by the processor 508, generates graphical data for providing a GUI to a second user 502. For example, the second GUI module 514 receives data describing one or more suggestions from the tuning module 512 and generates graphical data for providing a GUI depicting the one or more suggestions. The second GUI module 514 sends the graphical data to a display (not shown) communicatively coupled to the second client 506, causing the display to present the GUI to the second user 502. In one embodiment, the display is included in the second client 506. In other embodiments, the second GUI module 514 may generate any other graphical data for providing the functionality described herein.

Figure 6:
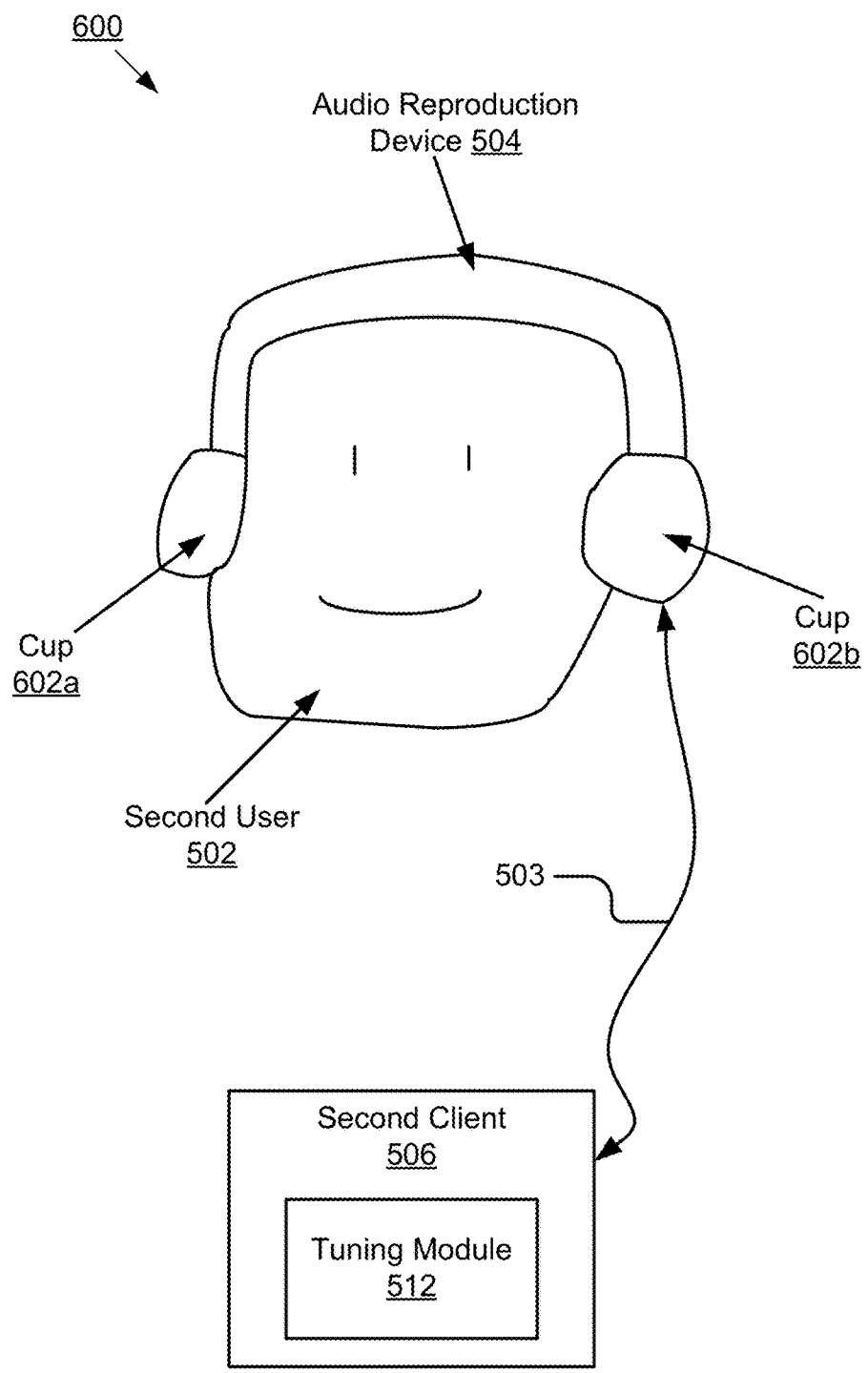
FIG. 6 is a graphical representation illustrating an example of a tuning system according to one embodiment.

FIG. 6 is a graphical representation 600 illustrating an example of a tuning system 500 according to one embodiment. In the illustrated embodiment, the audio reproduction device 504 includes one or more cups 602a and 602b (referred to individually or collectively as cup 602). In the depicted embodiment, the audio reproduction device 504 is a headphone device and the cups 602 are components of the headphone device. In one embodiment, the cup 602 is made in a variety of shapes such as a circular shape, an oval shape, a rectangular shape and any other shapes. In one embodiment, the cup 602 is a molded polymer or resin that houses a headphone driver for producing a sound wave from an audio signal. The cup 602 is further described below with reference to FIGS. 7 and 11-17.

The audio reproduction device 504 includes additional components that are not depicted in FIG. 6. However, a person having ordinary skill in the art will recognize that, in FIG. 6, the audio reproduction device 504 is a headphone device. Further details of the headphone device are depicted with reference to FIGS. 11-17. FIGS. 11-17 provide details about a super-aural and a supra-aural headphone device. In one embodiment, the audio reproduction device 504 is an in-ear headphone device, an earbud headphone device or a speaker dock or any other audio reproduction device.

Figure 7:
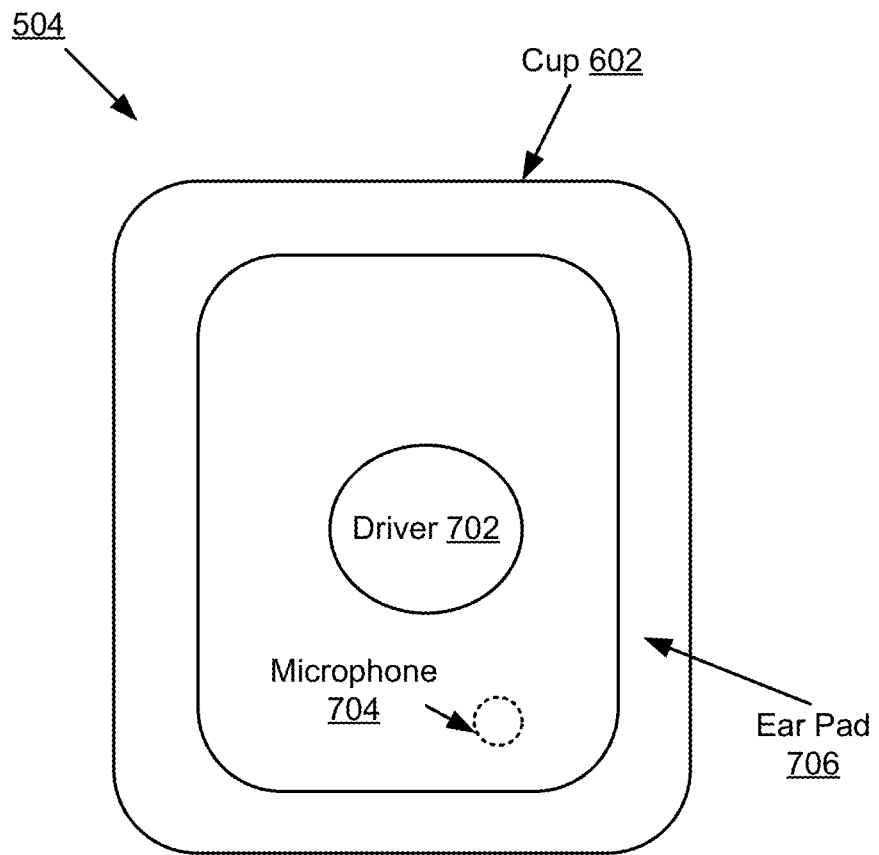
FIG. 7 is a block diagram illustrating a detailed view of an example audio reproduction device according to one embodiment.

FIG. 7 is a block diagram illustrating a detailed view of an example audio reproduction device 504 according to one embodiment. In the illustrated embodiment, the audio reproduction device 504 is configured to produce a sound wave that matches either a target sound signature or a sound signature within a target sound range as depicted in FIG. 9 or FIG. 18.

Figure 13:
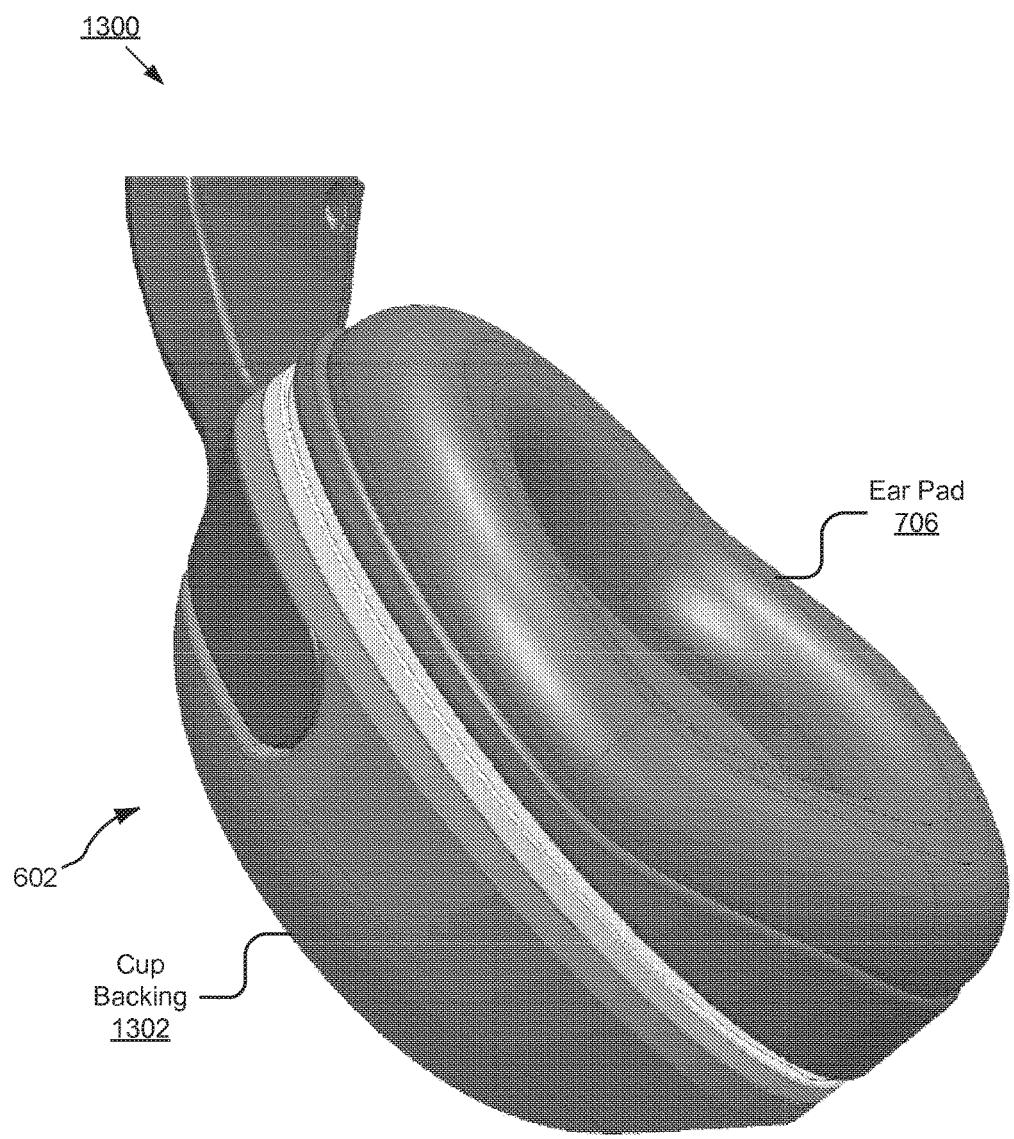
FIG. 13 is a graphical representation of a cup in an example audio reproduction device according to one embodiment.
Figure 15:
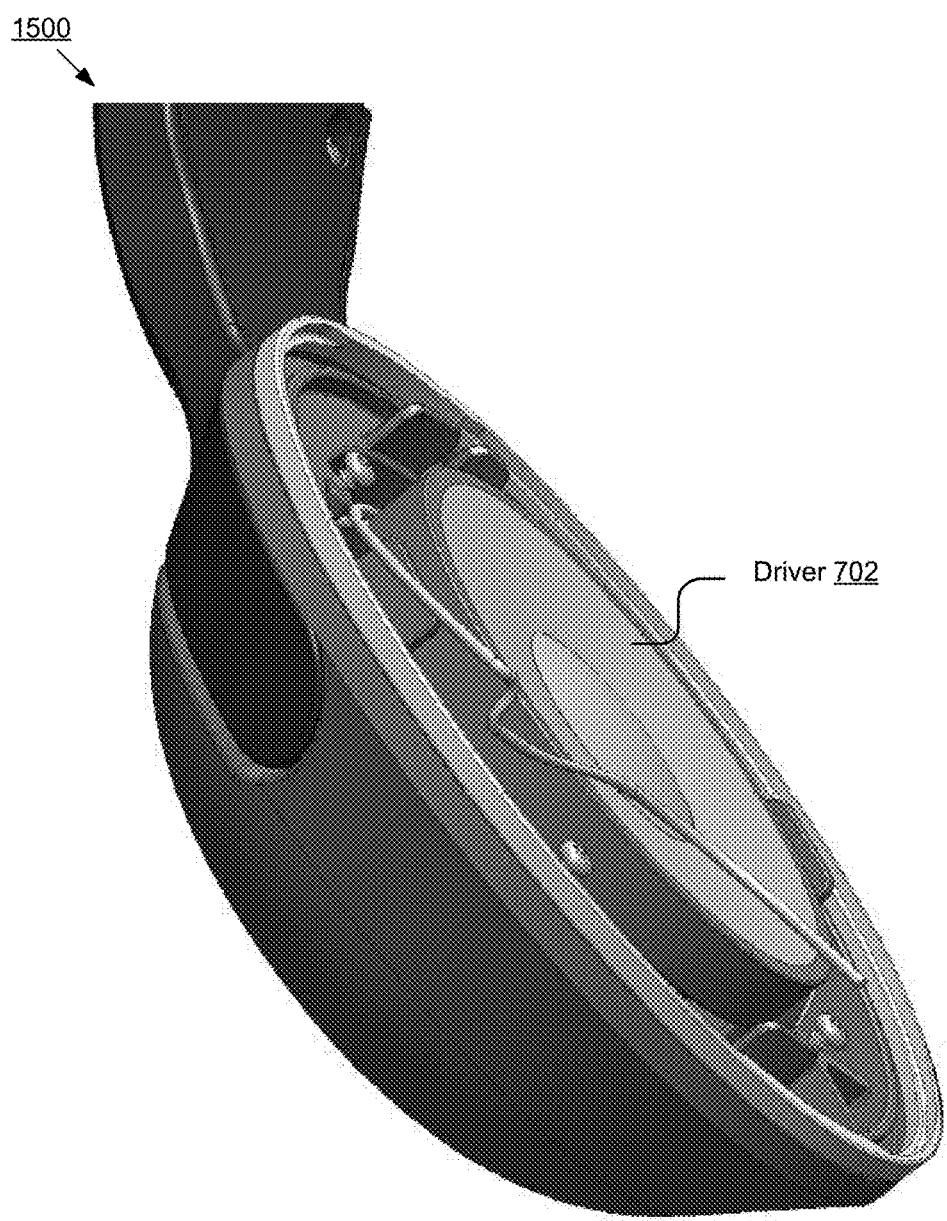
FIG. 15 is a graphical representation of an example driver mounted in a cup housing according to one embodiment.

The example audio reproduction device 504 includes a cup 602, a driver 702, an optional microphone 704 and an ear pad 706. The driver 702 is a device for reproducing a sound wave from an audio signal. An example driver 702 is shown in FIG. 15. The microphone 704 is a device for recording a sound wave generated by the driver 702 and generating a microphone signal that describes the sound wave. The microphone 704 transmits the microphone signal describing the sound wave to a microphone signal module of the tuning system described below with reference to microphone signal module 803 of FIG. 8. In one embodiment, the microphone 704 is an inline microphone built into a wire that connects the audio reproduction device 504 to the second client 506. The ear pad 706 is a cushioned pad mounted on the cup 602. An example of an ear pad 706 is illustrated in FIG. 13.

Figure 8:
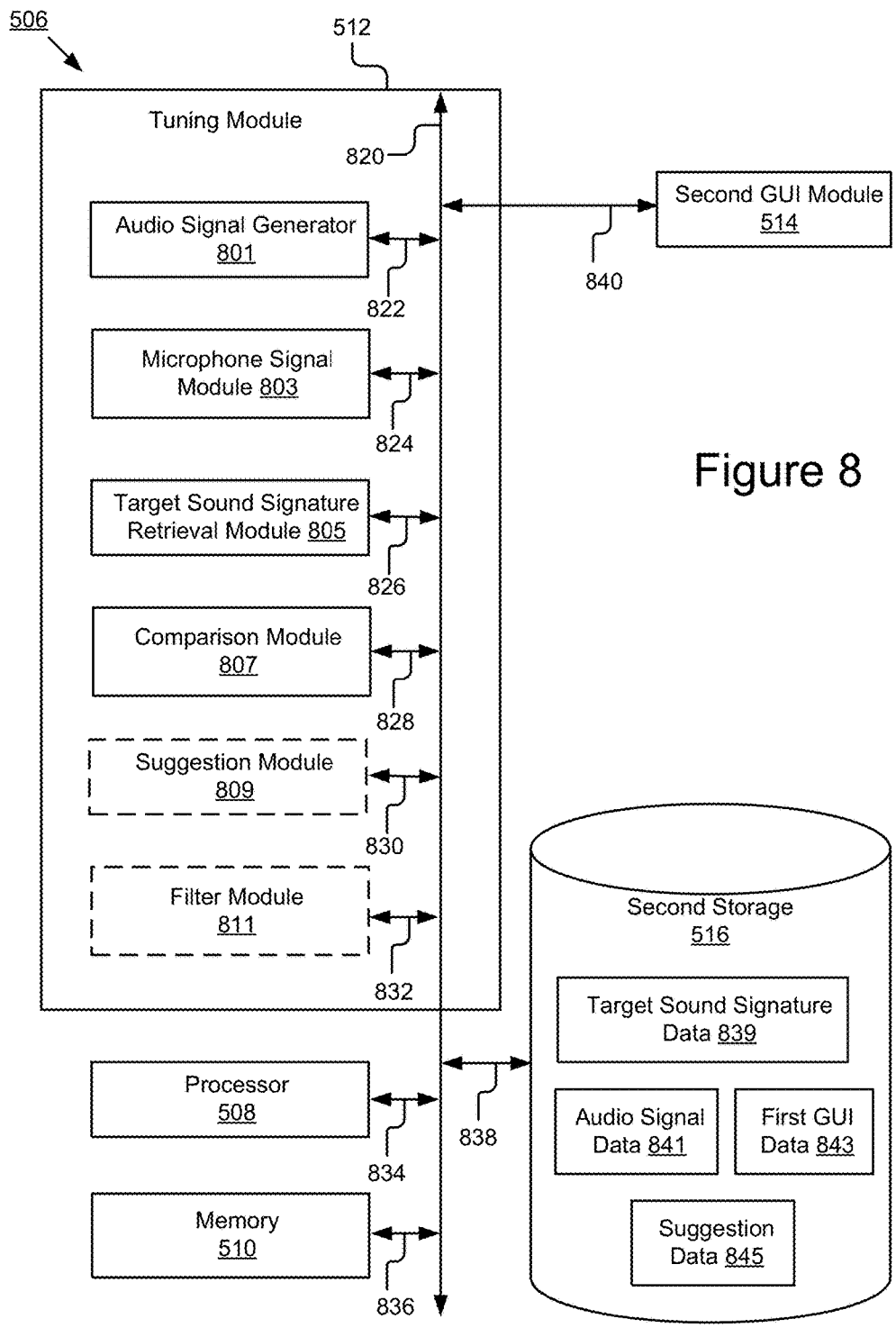
FIG. 8 is a block diagram illustrating a tuning module according to one embodiment.

FIG. 8 is a block diagram illustrating a tuning module 512 according to one embodiment. The components of the second client 506 are communicatively coupled to a bus 820. The second GUI module 514 is communicatively coupled to the bus 820 via signal line 840. The second storage 516 is communicatively coupled to the bus 820 via signal line 838. The processor 508 is communicatively coupled to the bus 820 via signal line 834. The memory 510 is communicatively coupled to the bus 820 via signal line 836.

In the illustrated embodiment, the tuning module 512 includes an audio signal generator 801, a microphone signal module 803, a target sound signature retrieval module 805, a comparison module 807, a suggestion module 809 and a filter module 811. The components of the tuning module 512 are communicatively coupled to each other. The suggestion module 809 and the filter module 811 are depicted using dashed lines to indicate that they are optional features of the tuning module 512.

The audio signal generator 801 is code and routines that, when executed by the processor 508, generates an audio signal. The audio signal generator 801 is communicatively coupled to the bus 820 via signal line 822. In one embodiment, the audio signal generator 801 retrieves the audio signal data 841 from the second storage 516 and generates an audio signal using the audio signal data 841. The audio signal data 841 is audio data used to generate an audio signal. The audio signal generator 801 sends the audio signal to the driver 702, causing the driver 702 to convert the audio signal to a sound wave. In one embodiment, the audio signal is configured to cause the audio reproduction device 504 to generate sound. The audio signal generator 801 sends the audio signal to an audio reproduction device 504 that converts the audio signal to a sound wave. In one embodiment, the sound wave has the same signature as a target sound signature. For example, the sound wave has the same sound pressure level as the target sound wave. In another embodiment, the sound wave has a sound signature within a target sound range. For example, the sound wave has a sound pressure level within the target sound range. In yet another embodiment, the signature of the sound wave is neither the same as a target sound signature nor within a target sound range. For example, the sound pressure level of the sound wave is outside the target sound range.

The microphone signal module 803 is code and routines that, when executed by the processor 508, receives a microphone signal from the microphone 704. The microphone signal module 803 is communicatively coupled to the bus 820 via signal line 824. In one embodiment, the microphone signal module 803 instructs the microphone 704 to record a sound wave when the driver 702 is converting an audio signal to the sound wave. The microphone 704 generates a microphone signal describing the sound wave and sends the microphone signal to the microphone signal module 803. In another embodiment, the microphone 704 is an inline microphone built into a wire that connects the audio reproduction device 504 to the second client 506. A user places the inline microphone close to the driver 702, causing the inline microphone to generate a microphone signal recording the sound wave generated by the driver 702. The microphone signal module 803 sends the microphone signal to the comparison module 807.

The target sound signature retrieval module 805 is code and routines that, when executed by the processor 508, retrieves target sound signature data 839 from the second storage 516. The target sound signature retrieval module 805 is communicatively coupled to the bus 820 via signal line 826. In one embodiment, the target sound signature data 839 is data describing a target sound signature and/or a sound signature within a target sound range. A sound signature is, for example, a sound pressure level of a sound wave. A target sound signature is a sound signature of a target sound wave that an audio reproduction device 504 aims to reproduce. For example, a target sound signature is a sound pressure level of a target sound wave. A target sound range is a range within which a target sound signature lies in. In one embodiment, a target sound range has a lower limit and an upper limit. Examples of a target sound signature and a target sound range are illustrated in FIGS. 9 and 18. In one embodiment, the target sound signature retrieval module 805 retrieves the target sound signature data 839 from the second storage 516 and sends the target sound signature data 839 to the comparison module 807.

The comparison module 807 is code and routines that, when executed by the processor 508, determines whether a microphone signal matches the target sound signature data 839. The comparison module 807 is communicatively coupled to the bus 820 via signal line 828. In one embodiment, the comparison module 807 determines whether a sound pressure level of the microphone signal is the same as the target sound signature. For example, the comparison module 807 measures values for the sound pressure level of the microphone signal at various frequencies and determines whether the values for the sound pressure level are the same as the target sound signature at various frequencies. If the microphone signal has the same sound pressure level as the target sound signature, the comparison module 807 determines that the microphone signal matches the target sound signature data 839.

If the microphone signal has a sound pressure level different from the target sound signature, then the comparison module 807 determines whether the microphone signal has a sound pressure level within a target sound range. For example, the comparison module 807 determines whether the values for the sound pressure level of the microphone signal are between a lower limit and an upper limit of the target sound range. If the microphone signal has a sound pressure level within the target sound range, the comparison module 807 determines that the microphone signal matches the target sound signature data 839. However, if the microphone signal has a sound pressure level outside the target sound range, the comparison module 807 determines that the microphone signal does not match the target sound signature data 839.

If the microphone signal matches the target sound signature data 839 indicating a sound wave generated by the audio reproduction device 504 matches either the target sound signature or a sound signature within the target sound range, the comparison module 807 determines that the audio reproduction device 504 does not need to be tuned. However, if the microphone signal does not match the target sound signature data 839, in one embodiment, the comparison module 807 determines differences between the microphone signal and a target sound signature. For example, the comparison module 807 determines differences between a first frequency response of the microphone signal and a second frequency response of the target sound signature. In another example, the comparison module 807 determines differences between a sound pressure level of the microphone signal and the target sound signature at various frequencies. In another embodiment, the comparison module 807 determines differences between the microphone signal and a sound signature within a target sound range. In either embodiment, the comparison module 807 sends the determined differences to the filter module 811. The comparison module 807 generates a mismatching signal and sends the mismatching signal to the suggestion module 809.

The suggestion module 809 is code and routines that, when executed by the processor 508, provides one or more suggestions to a second user 502. The suggestion module 809 is communicatively coupled to the bus 820 via signal line 830. In one embodiment, the suggestion module 809 receives a mismatching signal from the comparison module 807 and generates one or more suggestions responsive to the mismatching signal. For example, the suggestion module 809 retrieves suggestion data 845 from the second storage 516 and generates one or more suggestions based on the retrieved suggestion data 845. The suggestions are instructions for assisting the second user 502 to adjust the audio reproduction device 504 so that a better sound quality is achieved in the audio reproduction device 504. For example, the suggestions are directions for repositioning the audio reproduction device 504 on the user's head so that a better seal is formed and the target sound signature is achieved. The suggestion module 809 sends the one or more suggestions to the second GUI module 514, causing the second GUI module 514 to generate graphical data for providing a GUI that depicts the one or more suggestions to the second user 502.

Examples of a suggestion include, but are not limited to, adjusting a position of a cup 602, reconnecting the audio reproduction device 504 to a second client 506, etc. In other embodiments, other suggestions are possible.

The filter module 811 is code and routines that, when executed by the processor 508, filters audio signals. The filter module 811 is communicatively coupled to the bus 820 via signal line 832. In one embodiment, the filter module 811 receives the microphone signal from the microphone signal module 803 and the determined differences between the microphone signal and a target sound signature or a sound signature within a target sound range from the comparison module 807. The filter module 811 retrieves target sound signature data 839 describing a target sound signature or a sound signature within a target sound range from the second storage 516.

In one embodiment, the filter module 811 creates a digital filter based on one or more of the microphone signal, the target sound signature, the target sound range and the determined differences between the microphone signal and the target sound signature or a sound signature within the target sound range. The audio signal filtered by the digital filter causes the driver 702 to reproduce a sound wave that either matches the target sound signature or a sound signature within the target sound range. For example, the filter module 811 creates a digital filter so that when an audio signal is inputted to the digital filter, a filtered audio signal is generated whose corresponding sound wave reproduced by the audio reproduction device 504 matches either the target sound signature or a sound signature within the target sound range. In other words, the filter module 811 creates a digital filter and applies the digital filter to emulate a target sound signature or a sound signature within a target sound range, so that a sound wave reproduced by the audio reproduction device 504 either matches the target sound signature or a sound signature within the target sound range.

The second storage 516 stores data that includes target sound signature data 839, audio signal data 841, first GUI data 843 and suggestion data 845. The target sound signature data 839 and the audio signal data 841 are described above. The first GUI data 843 is graphical data for providing one or more GUIs to a second user 502. For example, the first GUI data 843 includes graphical data for providing a GUI that depicts one or more suggestions. The suggestion data 845 is data describing one or more suggestions. Example suggestions are described above.

FIG. 9 is a graphical representation 900 illustrating a target sound signature and a target sound range according to one embodiment. FIG. 9 depicts a target sound signature 904 (e.g., a sound pressure level (SPL) of a target sound wave) normalized at 1,000 hertz (Hz). FIG. 9 also includes an upper limit 902 and a lower limit 906 for the target sound signature 904. In the illustrated embodiment, a target sound range is a range between the upper limit 902 and the lower limit 906. In the depicted embodiment, the frequency responses are measured using the Head and Torso Simulator (HATS) manufactured by Bruel & Kjaer. In one embodiment, capture of acoustic data is performed using SOUND-CHECK® manufactured by Listen, Inc. Another example of a target sound signature and target sound range are illustrated with reference to FIG. 18.

FIG. 18 is a graphical representation 1800 illustrating a target sound signature and a target sound range according to another embodiment. FIG. 18 depicts a second example of a target sound signature 1804 (e.g., a sound pressure level of a target sound wave) normalized at 1,000 hertz (Hz). FIG. 18 also includes an upper limit 1802 and a lower limit 1806 for the target sound signature 1804. In the illustrated embodiment, a target sound range is the range between the upper limit 1802 and the lower limit 1806.

Figure 10A:
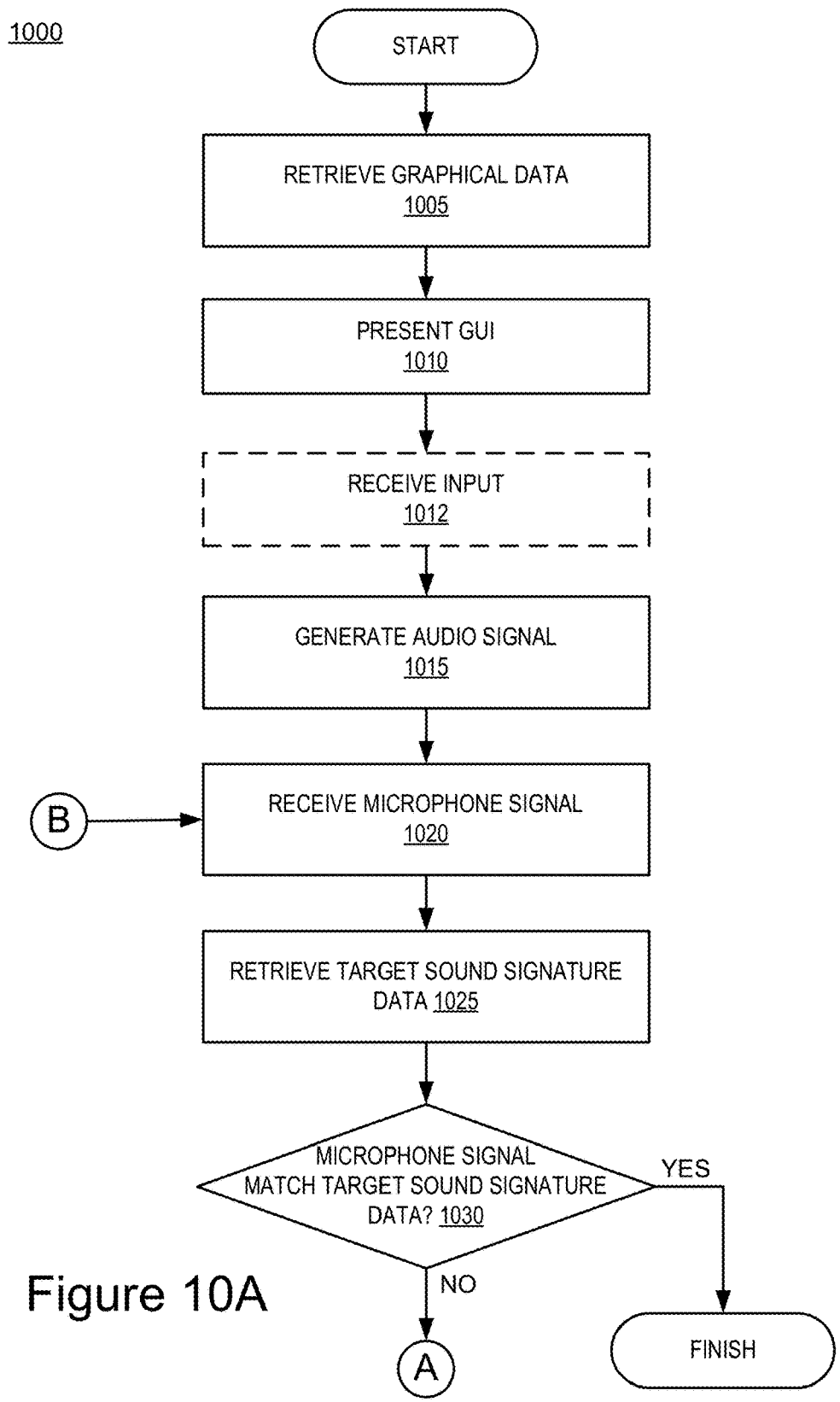
FIGS. 10A and 10B are flowcharts illustrating a method for tuning an audio reproduction device according to one embodiment.
Figure 10B:
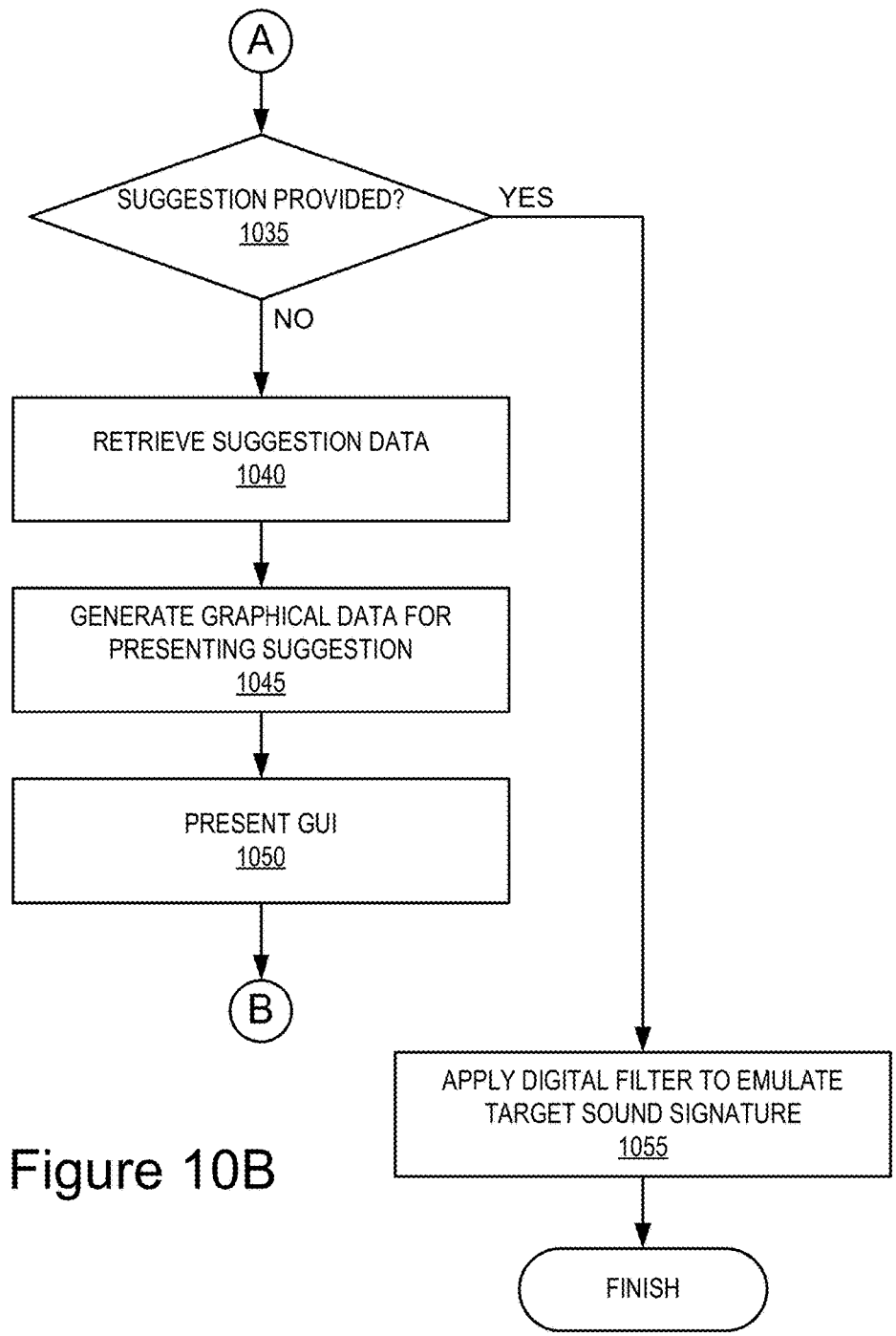

FIGS. 10A and 10B are flowcharts illustrating a method 1000 for tuning an audio reproduction device 504 according to one embodiment. Referring to FIG. 10A, the second GUI module 514 retrieves 1005 first GUI data 843 from the second storage 516 and sends the first GUI data 843 to a display (not shown) for presenting 1010 a GUI to the second user 502. In one embodiment, the GUI depicts a message that notifies the second user 502 that the audio quality of the audio reproduction device 504 is going to be tested. Optionally, the second user 502 provides an input by clicking on a "test" button included in the GUI and testing begins afterwards.

Optionally, the audio signal generator 801 receives 1012 an input from the second user 502. The audio signal generator 801 retrieves audio signal data 841 from the second storage 516 and generates 1015 an audio signal. In one embodiment, the audio signal generator 801 generates an audio signal using the audio signal data 841 and sends the audio signal to the driver 702. The driver 702 converts the audio signal to a sound wave. The microphone 704 records the sound wave and generates a microphone signal describing the sound wave. The microphone signal module 803 receives 1020 the microphone signal from the microphone 704 and sends the microphone signal to the comparison module 807.

The target sound signature retrieval module 805 retrieves 1025 target sound signature data 839 from the second storage 516. The target sound signature retrieval module 805 sends the target sound signature data 839 to the comparison module 807. The comparison module 807 determines 1030 whether the microphone signal matches the target sound signature data 839. If the microphone signal matches the target sound signature data 839, the method 1000 ends. Otherwise, the method 1000 moves to step 1035.

Referring to FIG. 10B, the suggestion module 809 determines 1035 whether one or more suggestions have been provided to the second user 502. If one or more suggestions have been provided to the second user 502, the method 1000 moves to step 1055. Otherwise, the method 1000 moves to step 1040. Turning to step 1040, the suggestion module 809 retrieves suggestion data 845 from the second storage 516 and generates one or more suggestions from the suggestion data 845. The suggestion module 809 sends the one or more suggestions to the second GUI module 514. The second GUI module 514 generates 1045 graphical data for providing a GUI depicting the one or more suggestions. The second GUI module 514 sends the graphical data to a display (not shown) for presenting 1050 the GUI to the second user 502. The method 1000 then moves to step 1020.

Turning to step 1055, the filter module 811 applies a digital filter to emulate a target sound signature or a sound signature within a target sound range. For example, the filter module 811 filters audio signals using the digital filter before sending the audio signals to the audio reproduction device 504 for playback, where the filtered audio signals cause the audio reproduction device 504 to reproduce a sound wave that matches either the target sound signature or a sound signature within the target sound range.

Figure 11:
FIG. 11 is a graphical representation of an example audio reproduction device according to one embodiment.
Figure 12:
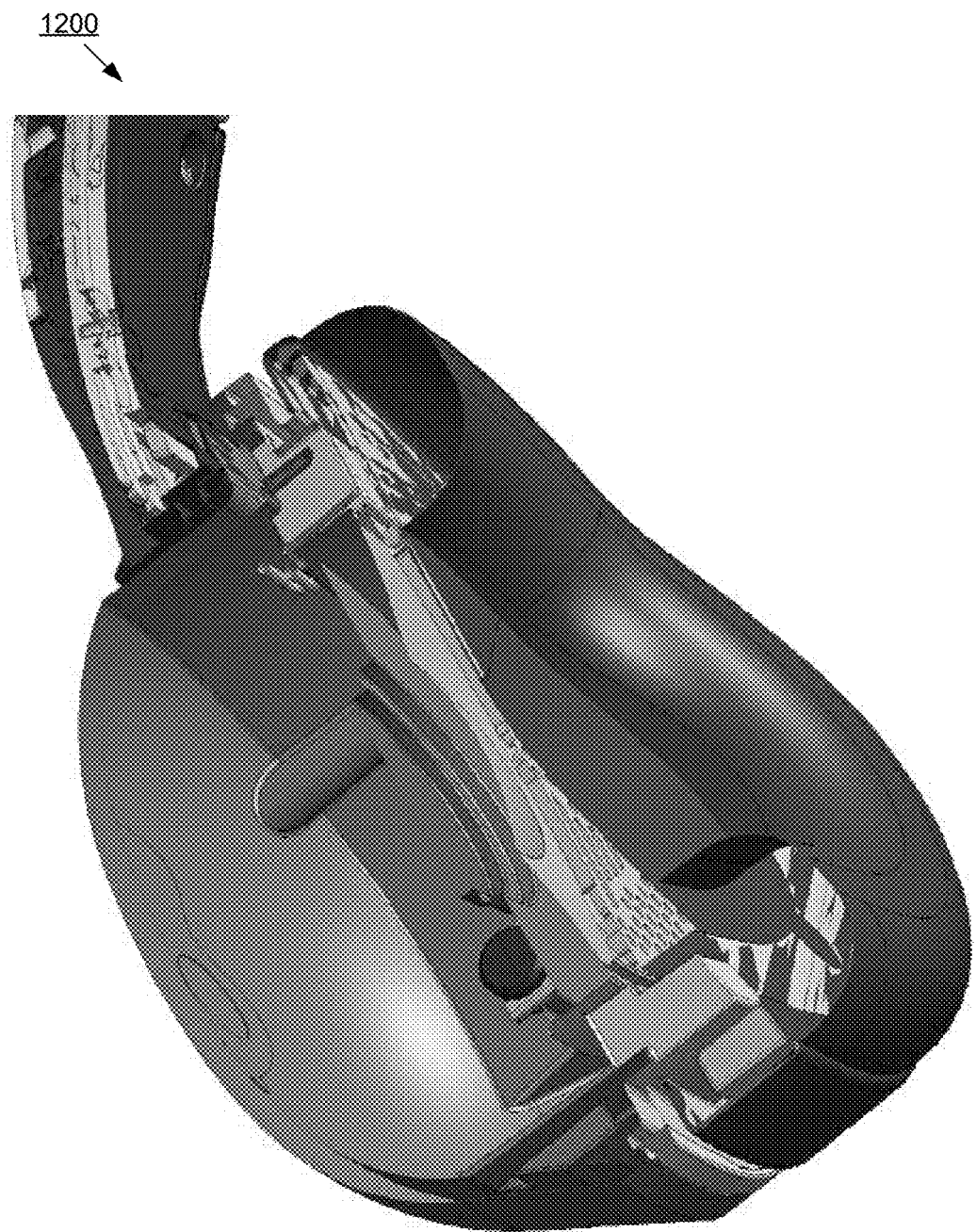
FIG. 12 is a cross-sectional view of a cup assembly in an example audio reproduction device according to one embodiment.
Figure 14:
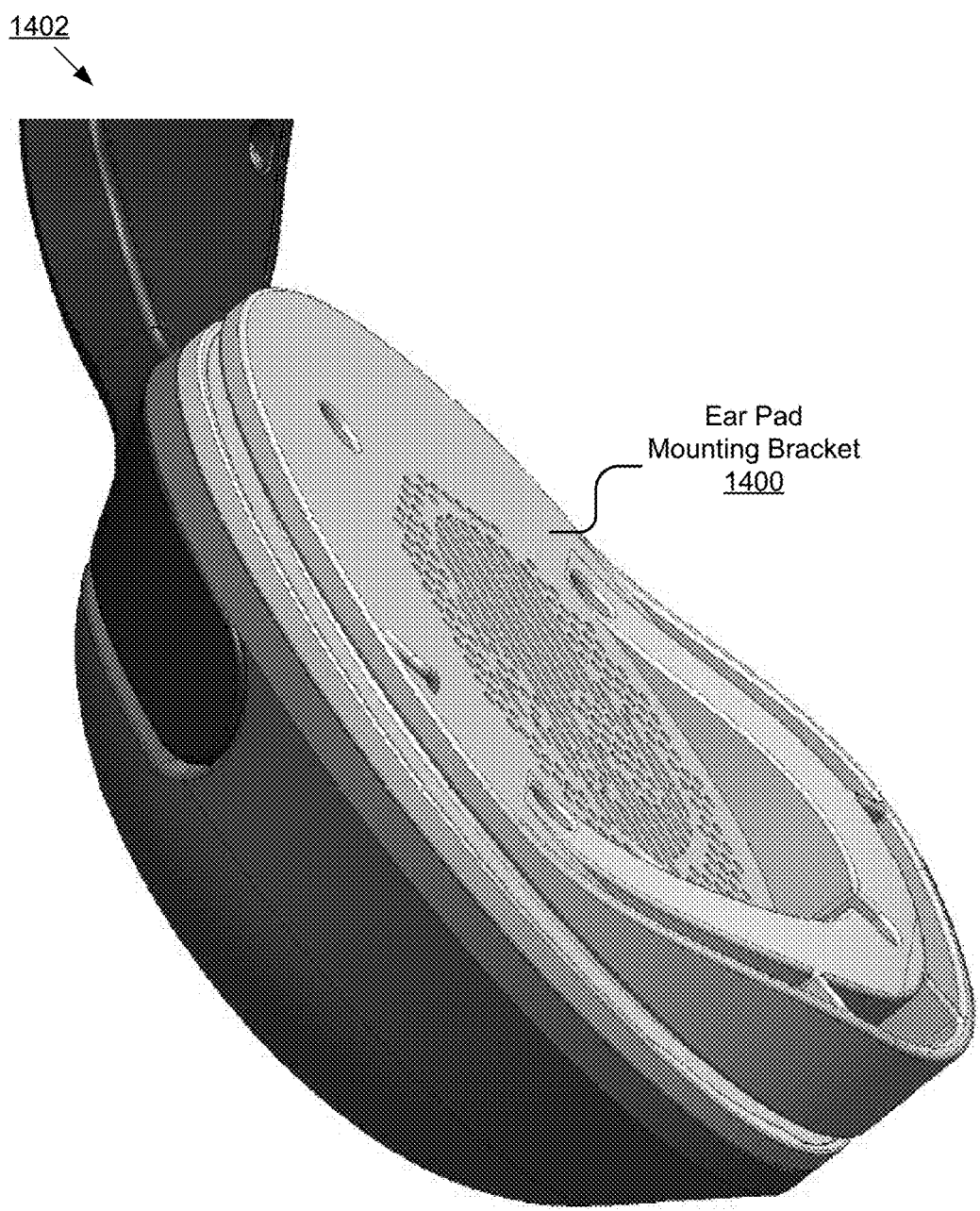
FIG. 14 is a graphical representation of an ear pad mounting bracket of an example audio reproduction device according to one embodiment.
Figure 16:
FIG. 16 is a graphical representation of a cup housing without a driver according to one embodiment.
Figure 17:
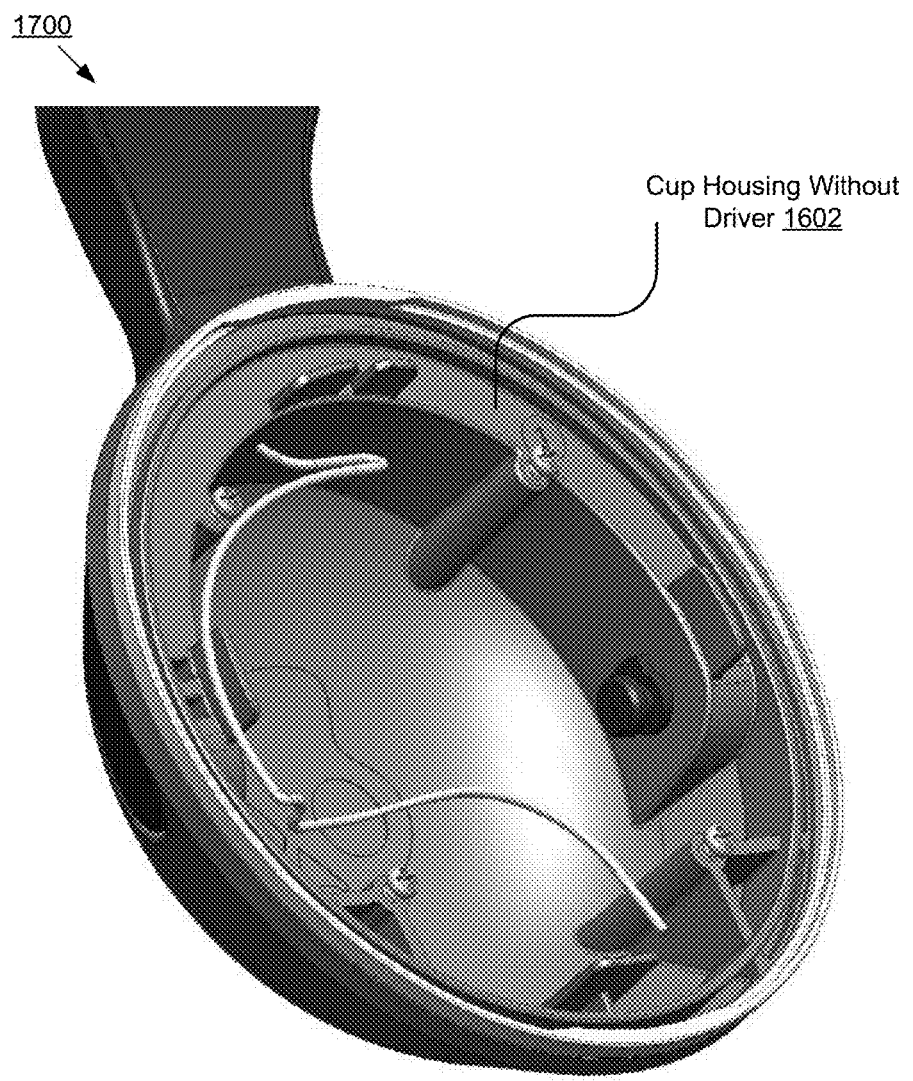
FIG. 17 is a graphical representation of a cup housing without a driver according to another embodiment.
Figure 18:
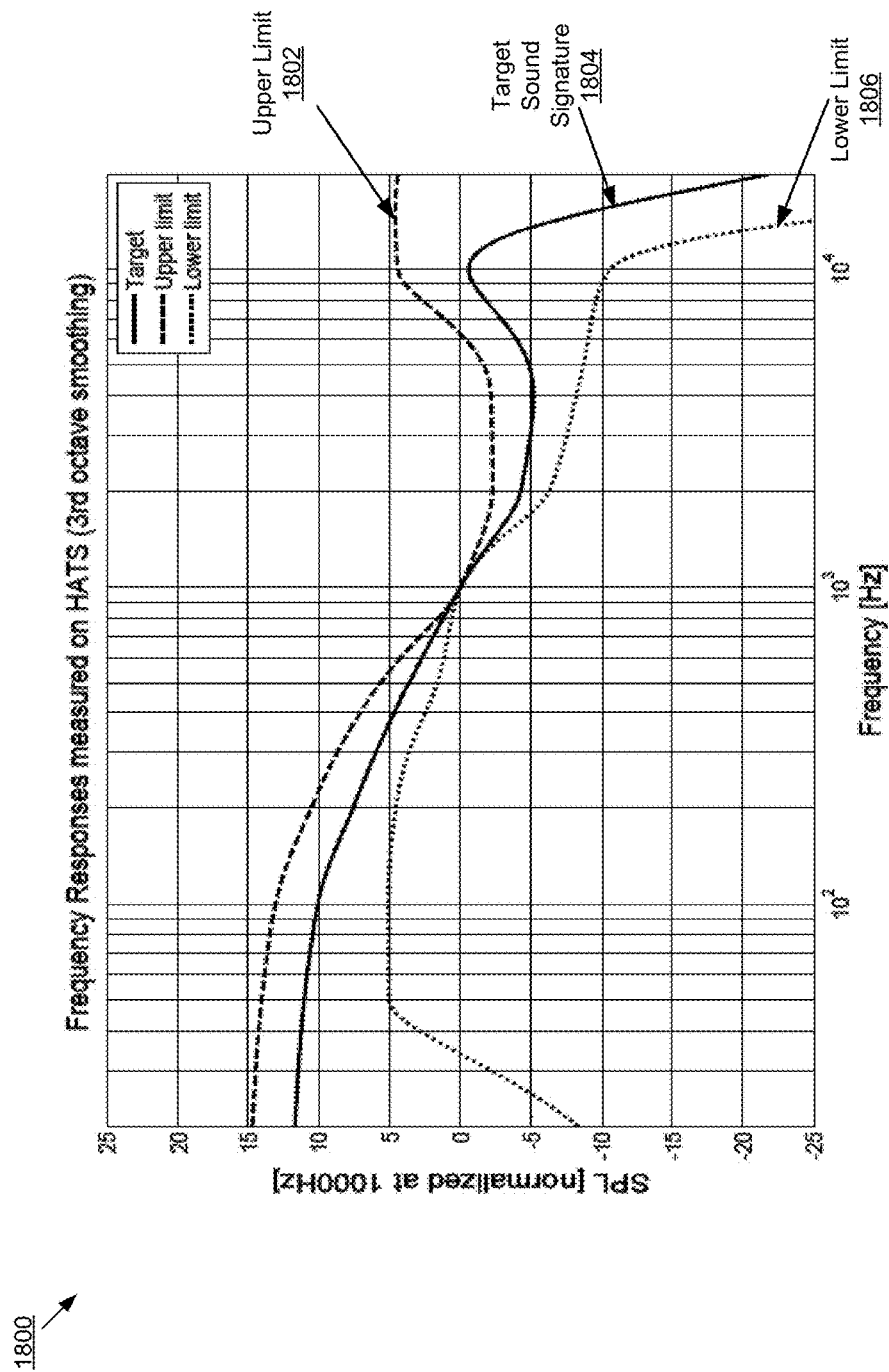
FIG. 18 is a graphical representation of a target sound signature and a target sound range according to another embodiment.

FIGS. 11-17 are graphical representations illustrating example audio reproduction devices 504 according to various embodiments. FIG. 11 is a graphical representation 1100 of an example audio reproduction device 504 according to one embodiment. FIG. 12 is a cross-sectional view 1200 of a cup assembly of an example audio reproduction device 504 according to one embodiment. FIG. 13 is a graphical representation 1300 of a cup 602 in an example audio reproduction device 504 according to one embodiment. The cup 602 includes a cup backing 1302 and an example ear pad 706. FIG. 14 is a graphical representation 1402 of an ear pad mounting bracket 1400 in an example audio reproduction device 504 according to one embodiment. FIG. 15 is a graphical representation 1500 of an example driver 702 mounted in a cup housing according to one embodiment. FIG. 16 is a graphical representation 1600 of a cup housing 1602 without a driver 702 according to one embodiment. FIG. 17 is a graphical representation 1700 of a cup housing 1602 without a driver 702 according to another embodiment.

In the foregoing description, for purposes of explanation, numerous specific details are set forth in order to provide a thorough understanding of the specification. It will be apparent, however, to one skilled in the art that the embodiments can be practiced without these specific details. In other instances, structures and devices are shown in block diagram form in order to avoid obscuring the specification. For example, the specification is described in one embodiment below with reference to user interfaces and particular hardware. However, the description applies to any type of computing device that can receive data and commands, and any peripheral devices providing services.

Reference in the specification to "one embodiment" or "an embodiment" means that a particular feature, structure, or characteristic described in connection with the embodiment is included in at least one embodiment. The appearances of the phrase "in one embodiment" in various places in the specification are not necessarily all referring to the same embodiment.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The specification also relates to an apparatus for performing the operations herein. This apparatus may be specially constructed for the required purposes, or it may comprise a general-purpose computer selectively activated or reconfigured by a computer program stored in the computer. Such a computer program may be stored in a computer-readable storage medium, such as, but is not limited to, any type of disk including floppy disks, optical disks, compact disc read-only memories (CD-ROMs), magnetic disks, read-only memories (ROMs), random access memories (RAMs), erasable programmable read-only memories (EPROMs), electrically erasable programmable read-only memories (EEPROMs), magnetic or optical cards, Flash memories including Universal Serial Bus (USB) keys with non-volatile memory or any type of media suitable for storing electronic instructions, each coupled to a computer system bus.

Some embodiments can take the form of an entirely hardware embodiment, an entirely software embodiment or an embodiment containing both hardware and software elements. A preferred embodiment is implemented in software, which includes, but is not limited to, firmware, resident software, microcode, etc.

Furthermore, some embodiments can take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

A data processing system suitable for storing and/or executing program code will include at least one processor coupled directly or indirectly to memory elements through a system bus. The memory elements can include local memory employed during actual execution of the program code, bulk storage, and cache memories that provide temporary storage of at least some program code in order to reduce the number of times code must be retrieved from bulk storage during execution.

Input/output "I/O" devices (including, but not limited to, keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modems and Ethernet cards are just a few of the currently available types of network adapters.

Finally, the algorithms and displays presented herein are not inherently related to any particular computer or other apparatus. Various general-purpose systems may be used with programs in accordance with the teachings herein, or it may prove convenient to construct more specialized apparatus to perform the required method steps. The required structure for a variety of these systems will appear from the description below. In addition, the specification is not described with reference to any particular programming language. It will be appreciated that a variety of programming languages may be used to implement the teachings of the various embodiments as described herein.

The foregoing description of the embodiments has been presented for the purposes of illustration and description. It is not intended to be exhaustive or to limit the specification to the precise form disclosed. Many modifications and variations are possible in light of the above teaching. It is intended that the scope of the embodiments be limited not by this detailed description, but rather by the claims of this application. As will be understood by those familiar with the art, the examples may be embodied in other specific forms without departing from the spirit or essential characteristics thereof. Likewise, the particular naming and division of the modules, routines, features, attributes, methodologies and other aspects are not mandatory or significant, and the mechanisms that implement the description or its features may have different names, divisions and/or formats. Furthermore, as will be apparent to one of ordinary skill in the relevant art, the modules, routines, features, attributes, methodologies and other aspects of the specification can be implemented as software, hardware, firmware or any combination of the three. Also, wherever a component, an example of which is a module, of the specification is implemented as software, the component can be implemented as a standalone program, as part of a larger program, as a plurality of separate programs, as a statically or dynamically linked library, as a kernel-loadable module, as a device driver, and/or in every and any other way known now or in the future to those of ordinary skill in the art of computer programming. Additionally, the specification is in no way limited to implementation in any specific programming language, or for any specific operating system or environment. Accordingly, the disclosure is intended to be illustrative, but not limiting, of the scope of the specification, which is set forth in the appended claims.

What is claimed is:

1. A method comprising:
    generating an audio signal having a target sound signature;
    sending the audio signal to a headphone that causes the headphone to produce a sound wave in response to the audio signal;
    receiving a microphone signal from a microphone carried by the headphone that captures a recorded audio signal of the sound wave produced by the headphone;
    determining whether the microphone signal is within a target sound range;
    applying a digital filter to the audio signal so that the filtered audio signal causes the headphone to produce a sound wave within the target sound range;
    generating one or more suggestions for assisting a user of the headphone to adjust the headphone so that differences between the microphone signal and the target sound range are reduced, wherein the one or more suggestions includes adjusting a position of a cup of the headphone; and
    providing the one or more suggestions to the user via a graphical user interface that is depicted on a display of a client device that is communicatively coupled to the headphone.

2. The method according to claim 1, wherein the target sound range is defined at least in part based on the target sound signature.

3. The method according to claim 1, further comprising determining one or more differences between the microphone signal and the target sound signature.

4. The method according to claim 3, wherein the digital filter is based on one or more of the microphone signal, the target sound signature, and the determined differences between the microphone signal and the target sound signature.

5. The method according to claim 1, wherein the target sound range is defined by an upper limit of the target sound signature and a lower limit of the target sound signature.

6. The method according to claim 5, wherein the digital filter is based on one or more of the microphone signal, and either or both the upper limit of the target sound signature and the lower limit of the target sound signature.

7. The method according to claim 1, wherein the target sound signature comprises a sound pressure level of the sound wave produced by the headphone.

8. The method according to claim 1, wherein the target sound signature comprises a sound pressure level that varies with frequency.

9. The method according to claim 1, wherein the target sound signature is normalized at 1,000 hertz.

10. The method according to claim 1, wherein the determining whether the microphone signal is within a target sound range occurs at two or more frequencies.

11. A method comprising:
    generating an audio signal having a target sound signature;
    sending the audio signal to a headphone that causes the headphone to produce a sound wave in response to the audio signal;
    receiving a microphone signal from a microphone carried by the headphone that captures a recorded audio signal of the sound wave produced by the headphone;
    determining whether the microphone signal substantially matches the target sound signature;
    applying a digital filter to the audio signal so that the filtered audio signal causes the headphone to produce a sound wave that substantially matches the target sound signature;
    generating one or more suggestions for assisting a user of the headphone to adjust the headphone so that differences between the microphone signal and the target sound signature are reduced, wherein the one or more suggestions includes adjusting a position of a cup of the headphone; and
    providing the one or more suggestions to the user via a graphical user interface that is depicted on a display of a client device that is communicatively coupled to the headphone.

12. The method according to claim 11, wherein determining whether the microphone signal substantially matches the target sound signature, comprises determining whether the microphone signal is within a target sound range defined by the target sound signature.

13. The method according to claim 11, wherein determining whether the microphone signal substantially matches the target sound signature, comprises determining whether the microphone signal is within a target sound range defined by the target sound signature, an upper limit, and a lower limit.

14. The method according to claim 11, further comprising determining one or more differences between the microphone signal and the target sound signature.

15. The method according to claim 14, wherein the digital filter is based on one or more of the microphone signal, the target sound signature, and the determined differences between the microphone signal and the target sound signature.

16. The method according to claim 11, wherein the target sound signature comprises a sound pressure level that varies with frequency.

17. The method according to claim 11, wherein the target sound signature is normalized at 1,000 hertz.

18. A tuning system comprising:
- a headphone configured to be worn by a user, the audio reproduction device headphone comprising:
  - an audio signal output; and
  - a microphone signal input; and
  - a processor coupled with the headphone, the processor configured to:
    - generate an audio signal having a target sound signature;
    - send the audio signal to the headphone via the audio signal output that causes the headphone to produce a sound wave in response to the audio signal;
    - receive a microphone signal via the microphone signal input that captures a recorded audio signal of the sound wave produced by the headphone;
    - determine whether the microphone signal is within a target sound range;
    - apply a digital filter to the audio signal so that the filtered audio signal causes the headphone to produce a sound wave within the target sound range;
    - generate one or more suggestions for assisting a user of the headphone to adjust the headphone so that differences between the microphone signal and the target sound range are reduced, wherein the one or more suggestions includes adjusting a position of a cup of the headphone; and
    - provide the one or more suggestions to the user via a graphical user interface that is depicted on a display of a client device that is communicatively coupled to the headphone.

* * * * *

UNITED STATES PATENT AND TRADEMARK OFFICE
CERTIFICATE OF CORRECTION

PATENT NO. : 10,129,641 B2  
APPLICATION NO. : 15/189894  
DATED : November 13, 2018  
INVENTOR(S) : Tetsuro Oishi Page 1 of 1

It is certified that error appears in the above-identified patent and that said Letters Patent is hereby corrected as shown below:

On the Title Page  
In ITEM (63) Related U.S. Application Data:  change "Jan. 4, 2013." to --Jan. 4, 2013, now U.S. Patent 9,735,751.--

In the Claims  
Claim 18, Column 19, Lines 12,13,  change "the audio reproduction device headphone" to --the headphone--

Signed and Sealed this  
First Day of January, 2019

Andrei Iancu  
*Director of the United States Patent and Trademark Office*